US011587769B2

(12) United States Patent
Ishida et al.

(10) Patent No.: US 11,587,769 B2
(45) Date of Patent: Feb. 21, 2023

(54) MICROWAVE OUTPUT DEVICE AND PLASMA PROCESSING APPARATUS

(71) Applicants: Tokyo Electron Limited, Tokyo (JP); TOKYO KEIKI INC., Tokyo (JP)

(72) Inventors: Yohei Ishida, Miyagi (JP); Kazushi Kaneko, Miyagi (JP); Hajime Tamura, Tokyo (JP); Koichi Murai, Tokyo (JP)

(73) Assignees: TOKYO ELECTRON LIMITED, Tokyo (JP); TOKYO KEIKI INC., Tokyo (JP)

( * ) Notice: Subject to any disclaimer, the term of this patent is extended or adjusted under 35 U.S.C. 154(b) by 34 days.

(21) Appl. No.: 17/381,698

(22) Filed: Jul. 21, 2021

(65) Prior Publication Data
US 2022/0028661 A1    Jan. 27, 2022

(30) Foreign Application Priority Data

Jul. 22, 2020   (JP) .............................. JP2020-125643

(51) Int. Cl.
*H01J 37/32* (2006.01)
(52) U.S. Cl.
CPC .. *H01J 37/32201* (2013.01); *H01J 37/32229* (2013.01); *H01J 37/32275* (2013.01); *H01J 37/32935* (2013.01)
(58) Field of Classification Search
CPC ................ H01J 37/32; H01J 37/32201; H01J 37/32229; H01J 37/32275; H01J 37/32935; H01J 37/32266; H01J 37/32311; H01J 37/32302
See application file for complete search history.

(56) References Cited

U.S. PATENT DOCUMENTS

| | | | | |
|---|---|---|---|---|
| 6,081,163 A | * | 6/2000 | Ujiie | H03L 7/18 331/25 |
| 2007/0066268 A1 | * | 3/2007 | Simic | H04B 1/26 455/318 |
| 2015/0015426 A1 | * | 1/2015 | Lindahl | H03M 5/08 341/53 |
| 2016/0131587 A1 | * | 5/2016 | Meloni | H01J 37/32935 250/206 |
| 2019/0341228 A1 | * | 11/2019 | Kaneko | H01J 37/32229 |
| 2021/0280390 A1 | * | 9/2021 | Kaneko | H01J 37/3299 |
| 2021/0407771 A1 | * | 12/2021 | Funk | H01J 37/32174 |

FOREIGN PATENT DOCUMENTS

JP        2019-036482 A       3/2019

* cited by examiner

*Primary Examiner* — Wilson Lee
(74) *Attorney, Agent, or Firm* — Pearne & Gordon LLP

(57) ABSTRACT

A device includes a microwave generator configured to generate a microwave having a bandwidth, an output unit, a directional coupler and a measurer. The microwave generator generates a microwave a power of which is pulse-modulated to be a High level and a Low level. A set carrier pitch is set to satisfy a preset condition. The preset condition includes a condition that a value obtained by dividing a set pulse frequency by the set carrier pitch or a value obtained by dividing the set carrier pitch by the set pulse frequency is not an integer and a condition that an ON-time of the High level is equal to or larger than 50%. The microwave generator averages a first High measurement value and a first Low measurement value in a preset moving average time longer than a sum of the ON-time of the High level at a preset sampling interval.

5 Claims, 21 Drawing Sheets

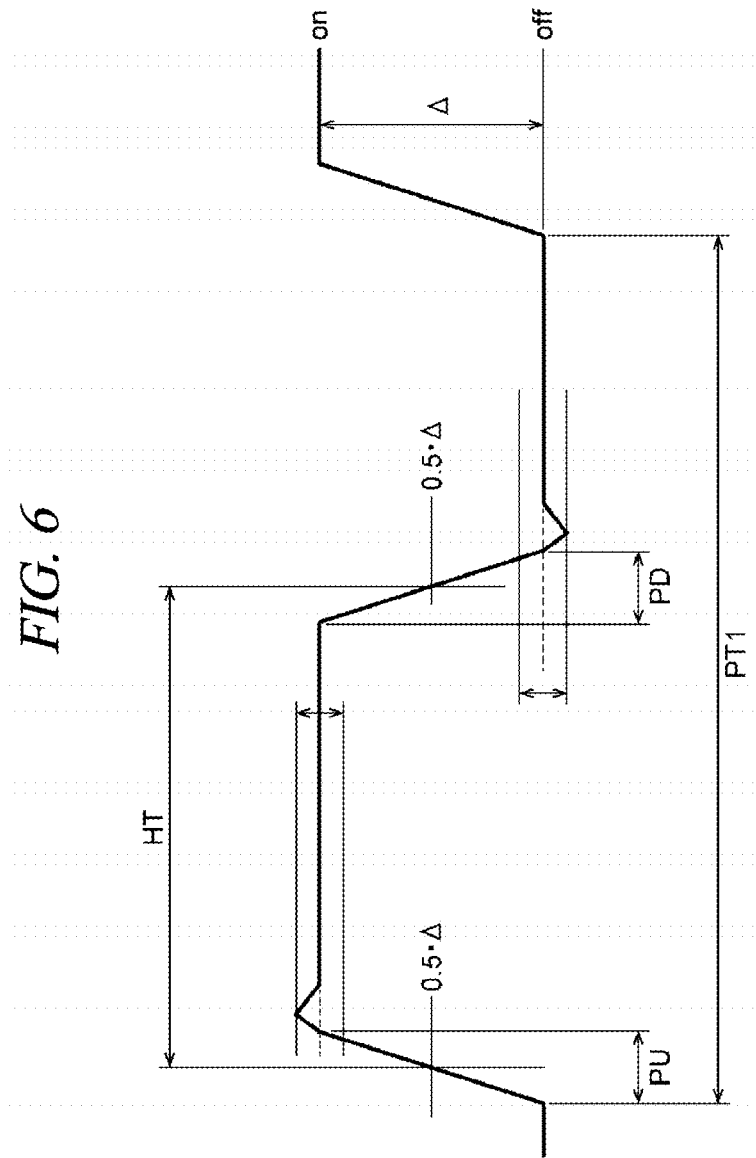

FIG. 16A

| t | V(t) | P(t) | NUMBER OF APPEARANCE |
|---|------|------|----------------------|
| 0 | 1.00 | 1506 | 1000 |
| 1 | 1.00 | 1532 | 1000 |
| . | | | |
| 9 | 1.00 | 1525 | 1000 |
| 10 | 1.00 | 1502 | 0 |
| . | | | |
| 50 | 1.00 | 1527 | 0 |
| . | | | |
| 99 | 1.00 | 1493 | 0 |

FIG. 16B

| t | V(t) | P(t) | NUMBER OF APPEARANCE |
|---|------|------|----------------------|
| 0 | 1.00 | 1547 | 120 |
| 1 | 1.00 | 1565 | 119 |
| . | | | |
| 9 | 1.00 | 1470 | 111 |
| 10 | 1.00 | 1454 | 110 |
| . | | | |
| 50 | 1.00 | 1453 | 110 |
| . | | | |
| 98 | 1.00 | 1517 | 121 |

MICROWAVE OUTPUT DEVICE AND PLASMA PROCESSING APPARATUS

CROSS-REFERENCE TO RELATED APPLICATION

This application claims the benefit of Japanese Patent Application No. 2020-125643 filed on Jul. 22, 2020, the entire disclosure of which is incorporated herein by reference.

TECHNICAL FIELD

The various aspects and embodiments described herein pertain generally to a microwave output device and a plasma processing apparatus.

BACKGROUND

Patent Document 1 describes a plasma processing apparatus using a microwave. This plasma processing apparatus is equipped with a microwave output device configured to output a microwave having a bandwidth. The microwave output device controls a power of the microwave which is pulse-modulated.

Patent Document 1: Japanese Patent Laid-open Publication No. 2019-036482

SUMMARY

In one exemplary embodiment, there is provided a microwave output device. The microwave output device includes a microwave generator, an output unit, a first directional coupler and a measurer. The microwave generator is configured to generate a microwave having a median frequency and a bandwidth respectively corresponding to a set frequency, a set bandwidth and a set carrier pitch instructed from a control device. A power of the microwave is pulse-modulated such that a pulse frequency, a duty ratio, a High level and a Low level become a set pulse frequency, a set duty ratio, a set power of High level and a set power of Low level instructed from the control device. Further, duty ratio is a value obtained by dividing a High level period by a pulse cycle (the High level period+a Low level period). The output unit is configured to output the microwave propagated from the microwave generator. The first directional coupler is configured to output a part of a progressive wave propagated from the microwave generator to the output unit. The measurer is configured to determine a first High measurement value and a first Low measurement value respectively indicating a High level and a Low level of a power of the progressive wave in the output unit, based on the part of the progressive wave outputted from the first directional coupler. A reciprocal of the set carrier pitch becomes a longest cycle among power variation cycles of the microwave having a multi-carrier bandwidth, and the set carrier pitch is set to satisfy a preset condition. The preset condition includes a condition that a value obtained by dividing the set pulse frequency by the set carrier pitch or a value obtained by dividing the set carrier pitch by the set pulse frequency is not an integer (first condition). The preset condition includes a condition that an ON-time of the High level with respect to a cycle of the microwave in the set duty ratio is equal to or larger than 50% (second condition). The microwave generator averages the first High measurement value and the first Low measurement value in a preset moving average time at a preset sampling interval. The preset moving average time is longer than a sum of the ON-time of the High level (third condition). The microwave generator controls the power of the High level of the pulse-modulated microwave based on the averaged first High measurement value and the set power of High level. The microwave generator controls the power of the Low level of the pulse-modulated microwave based on the averaged first Low measurement value and the set power of Low level.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 6 shows an example of a synchronization signal for modulating a power of a microwave;

FIG. 16A and FIG. 16B present examples of measurement values in a case where a microwave power is pulse-modulated;

DETAILED DESCRIPTION

Figure 1:
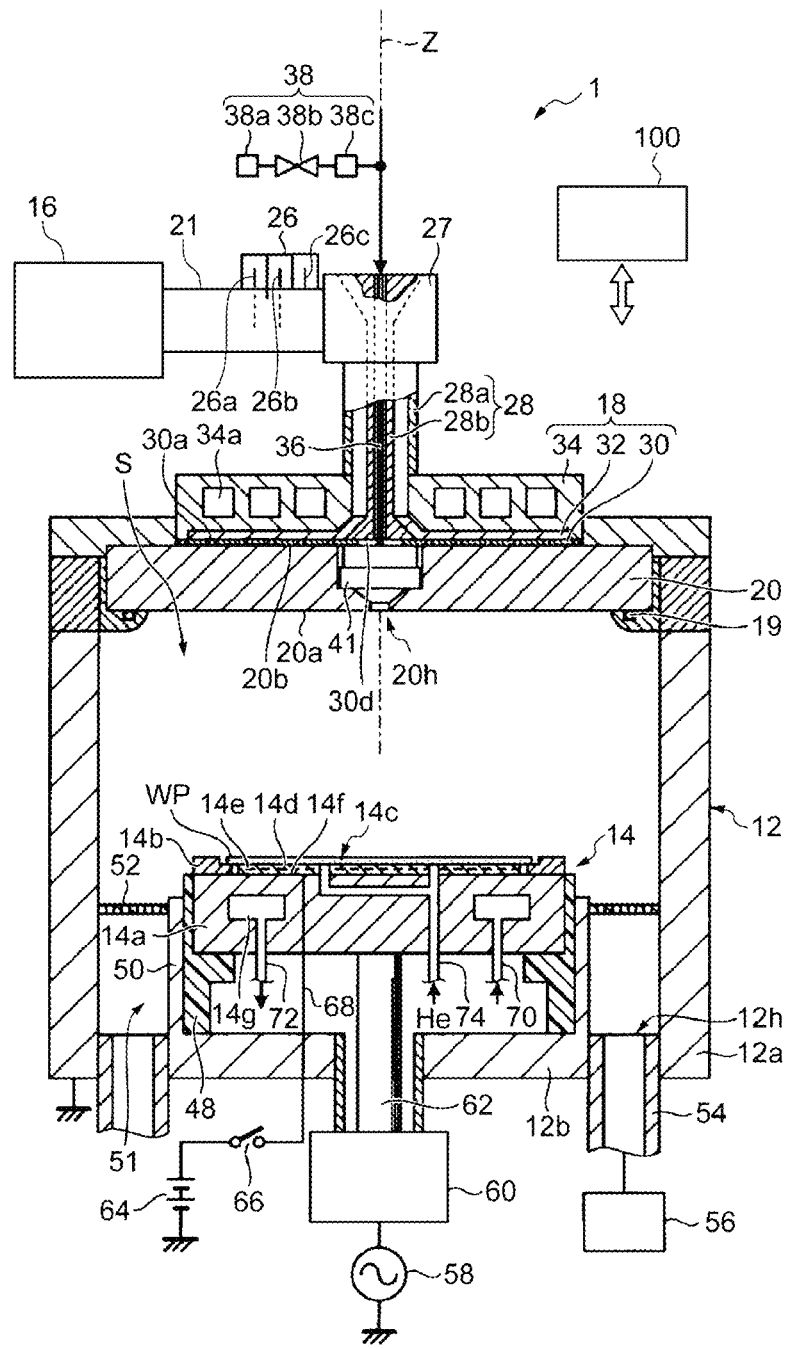
FIG. 1 is a diagram illustrating an example of a plasma processing apparatus according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments will be described.

In one exemplary embodiment, there is provided a microwave output device. The microwave output device includes a microwave generator, an output unit, a first directional coupler and a measurer. The microwave generator is configured to generate a microwave having a median frequency and a bandwidth respectively corresponding to a set frequency, a set bandwidth and a set carrier pitch instructed from a control device. A power of the microwave is pulse-modulated such that a pulse frequency, a duty ratio, a High level and a Low level becomes a set pulse frequency, a set duty ratio, a set power of High level and a set power of Low level instructed from the control device. Further, duty ratio is a value obtained by dividing a High level period by a pulse cycle (the High level period+a Low level period). The output unit is configured to output the microwave propagated from the microwave generator. The first directional coupler is configured to output a part of a progressive wave propagated from the microwave generator to the output unit. The measurer is configured to determine a first High measurement value and a first Low measurement value respectively indicating a High level and a Low level of a power of the progressive wave in the output unit, based on the part of the progressive wave outputted from the first directional coupler. A reciprocal of the set carrier pitch becomes a longest cycle among power variation cycles of the microwave having a multi-carrier bandwidth, and the set carrier pitch is set to satisfy a preset condition. The preset condition includes a condition that a value obtained by dividing the set pulse frequency by the set carrier pitch or a value obtained by dividing the set carrier pitch by the set pulse frequency is not an integer (first condition). The preset condition includes a condition that an ON-time of the High level with respect to a cycle of the microwave in the set duty ratio is equal to or larger than 50% (second condition). The microwave generator averages the first High measurement value and the first Low measurement value in a preset moving average time at a preset sampling interval. The preset moving average time is longer than a sum of the ON-time of the High level (third condition). The microwave generator controls the power of the High level of the pulse-modulated microwave based on the averaged first High measurement value and the set power of High level. The microwave generator controls the power of the Low level of the pulse-modulated microwave based on the averaged first Low measurement value and the set power of Low level.

In this microwave output device, the power of the microwave having the multi-carrier bandwidth is pulse-modulated. The power of the High level of the pulse-modulated microwave is controlled based on the averaged first High measurement value and the set power of High level. Further, the power of the Low level of the pulse-modulated microwave is controlled based on the averaged first Low measurement value and the set power of Low level. As stated above, by pulse-modulating the power of the microwave and by controlling the power of the High level and the power of the Low level based on the set power, the pulse-modulated power of the microwave having the multi-carrier bandwidth can be controlled. Further, when the set carrier pitch of the microwave satisfies the three conditions described above, a waveform of the power of the High level can be cut to be appropriately averaged, so that a fluctuation of power (a difference from the set power) can be suppressed. Thus, this device is capable of controlling the power of the pulse-modulated microwave having the bandwidth with high accuracy.

In one exemplary embodiment, the microwave output device may further include a second directional coupler configured to output a part of a reflection wave returned back to the output unit. The measurer determines a second High measurement value and a second Low measurement value respectively indicating a High level and a Low level of a power of the reflection wave in the output unit, based on the part of the reflection wave outputted from the second directional coupler. The microwave generator averages the second High measurement value and the second Low measurement value in a preset moving average time at a preset sampling interval. The microwave generator controls the power of the High level of the pulse-modulated microwave based on the averaged first High measurement value, the averaged second High measurement value, and the set power of High level. The microwave generator controls the power of the Low level of the pulse-modulated microwave based on the averaged first Low measurement value, the averaged second Low measurement value, and the set power of Low level.

With this configuration, the microwave output device can control a power based on the power of the reflection wave. Further, even with the power of the reflection wave, the waveform of the power of the High level can be cut to be appropriately averaged.

In another exemplary embodiment, there is provided a plasma processing apparatus. The plasma processing apparatus includes a chamber main body and a microwave output device. The microwave output device is configured to output a microwave for exciting a gas supplied into the chamber main body. This microwave output device is the microwave output device as described in the above exemplary embodiment.

Hereinafter, the various exemplary embodiments will be described in detail with reference to the accompanying drawings. In the various drawings, same or corresponding parts will be assigned same reference numerals.

[Plasma Processing Apparatus]

FIG. 1 is a diagram illustrating a plasma processing apparatus according to an exemplary embodiment. As shown in FIG. 1, a plasma processing apparatus 1 includes a chamber main body 12 and a microwave output device 16. The plasma processing apparatus 1 may be further equipped with a stage 14, an antenna 18 and a dielectric window 20.

The chamber main body 12 provides a processing space S therein. The chamber main body 12 has a sidewall 12a and a bottom 12b. The sidewall 12a is formed to have a substantially cylindrical shape. A central axis of this sidewall 12a substantially coincides with an axis Z extending in a vertical direction. The bottom 12b is provided at a lower end side of the sidewall 12a. An exhaust hole 12h for gas exhaust is provided at the bottom 12b. Further, an upper end of the sidewall 12a is opened.

The dielectric window 20 is provided on the upper end of the sidewall 12a. This dielectric window 20 has a bottom surface 20a facing the processing space S. The dielectric window 20 closes an opening at the upper end of the sidewall 12a. An O-ring 19 is disposed between the dielectric window 20 and the upper end of the sidewall 12a. The O-ring 19 allows the chamber main body 12 to be hermetically sealed more securely.

The stage 14 is accommodated in the processing space S. The stage 14 is disposed to face the dielectric window 20 in the vertical direction. Further, the stage 14 is disposed such that the processing space S exists between the dielectric window 20 and the stage 14. This stage 14 is configured to support a processing target object WP (for example, wafer) placed thereon.

In one exemplary embodiment, the stage 14 includes a base 14a and an electrostatic chuck 14c. The base 14a has a substantially disk shape, and is made of a conductive material such as aluminum. A central axis of the base 14a substantially coincides with the axis Z. This base 14a is supported by a cylindrical supporting member 48. The cylindrical supporting member 48 is made of an insulating material and extended vertically upwards from the bottom 12b. A conductive cylindrical supporting member 50 is provided around the cylindrical supporting member 48. The cylindrical supporting member 50 is extended vertically upwards from the bottom 12b of the chamber main body 12 along a side surface of the cylindrical supporting member 48. An annular exhaust path 51 is formed between this cylindrical supporting member 50 and the sidewall 12a.

A baffle plate 52 is provided in an upper portion of the exhaust path 51. The baffle plate 52 has a ring shape. The baffle plate 52 is provided with a multiple number of through holes which are formed through the baffle plate 52 in a plate thickness direction. The aforementioned exhaust hole 12h is provided under the baffle plate 52. An exhaust device 56 is connected to the exhaust hole 12h through an exhaust line 54. The exhaust device 56 has an automatic pressure control valve (APC) and a vacuum pump such as a turbo molecular pump. The processing space S can be decompressed to a required vacuum level by this exhaust device 56.

The base 14a also serves as a high frequency electrode. The base 14a is electrically connected with a high frequency power supply 58 for high frequency bias via a power feed rod 62 and a matching unit 60. The high frequency power supply 58 is configured to output a high frequency power having a constant frequency, e.g., 13.56 MHz, suitable for controlling energy of ions to be attracted into the processing target object WP at a set power level.

Further, the high frequency power supply 58 may have a pulse generator to modulate the high frequency power (RF power) in a pulse shape and apply this pulse-modulated high frequency power to the base 14a. In this case, the high frequency power supply 58 pulse-modulates the high frequency power such that a High-level power and a Low-level power are repeated periodically. The high frequency power supply 58 adjusts the pulse based on a synchronization signal PSS-R generated by the pulse generator. The synchronization signal PSS-R is a signal which determines a cycle and a duty ratio of the high frequency power. As an example of settings for the pulse modulation, a pulse frequency may be in a range from 10 Hz to 250 kHz, and a pulse duty ratio (a ratio of a High-level power period to the pulse cycle) may be in a range from 10% to 90%.

The matching unit 60 accommodates therein a matching device configured to match an impedance of the high frequency power supply 58 and an impedance at a load side such as, mainly, an electrode, plasma or the chamber main body 12. This matching device includes a blocking capacitor for self-bias generation. The matching unit 60 is operated to carry out the matching based on the synchronization signal PSS-R when the high frequency power is pulse-modulated.

The electrostatic chuck 14c is disposed on a top surface of the base 14a. The electrostatic chuck 14c holds the processing target object WP by an electrostatic attracting force. The electrostatic chuck 14c includes an electrode 14d, an insulating film 14e and an insulating film 14f, and has a substantially disk shape. A central axis of the electrostatic chuck 14c substantially coincides with the axis Z. The electrode 14d of this electrostatic chuck 14c is made of a conductive film and embedded between the insulating films 14e and 14f. The electrode 14d is electrically connected with a DC power supply 64 via a switch 66 and a coating line 68. The electrostatic chuck 14c is capable of attracting and holding the processing target object WP by a Coulomb force generated by a DC voltage applied from the DC power supply 64. Further, a focus ring 14b is provided on the base 14a. The focus ring 14b is disposed to surround the processing target object WP and the electrostatic chuck 14c.

A coolant path 14g is provided within the base 14a. For example, the coolant path 14g is extended around the axis Z. A coolant from a chiller unit is supplied into this coolant path 14g through a pipeline 70. The coolant supplied into the coolant path 14g is returned back into the chiller unit through a pipeline 72. As a temperature of the coolant is controlled by the chiller unit, a temperature of the electrostatic chuck 14c, and, ultimately, a temperature of the processing target object WP are controlled.

Further, a gas supply line 74 is formed in the stage 14. This gas supply line 74 is provided to supply a heat transfer gas, for example, a He gas into a gap between a top surface of the electrostatic chuck 14c and a rear surface of the processing target object WP.

The microwave output device 16 outputs a microwave for exciting a processing gas supplied into the chamber main body 12. The microwave output device 16 is configured to vary (adjust) a frequency, a power and a bandwidth of the microwave. For example, by setting the bandwidth of the microwave to be approximately zero, the microwave output device 16 is capable of generating a microwave having a single frequency. Further, the microwave output device 16 is capable of generating a microwave having a bandwidth including multiple frequency components. Powers of these multiple frequency components may be same, or only a median frequency component within the band may have a power larger than those of the other frequency components. As an example, the microwave output device 16 is capable of adjusting the power of the microwave within a range from 0 W to 5000 W. The microwave output device 16 is capable of adjusting the frequency or the median frequency of the microwave within a range from 2400 MHz to 2500 MHz. The microwave output device 16 is capable of adjusting the bandwidth of the microwave within a range from 0 MHz to 100 MHz. Further, the microwave output device 16 is capable of adjusting a pitch (carrier pitch) of frequencies of the multiple frequency components of the microwave within the band within a range from 0 kHz to 25 kHz.

The microwave output device 16 may have a pulse generator to modulate the power of the microwave in a pulse shape and output this pulse-modulated power of the microwave. In this case, the microwave output device 16 pulse-modulates the power of the microwave such that a High-level power and a Low-level power are repeated periodically. The microwave output device 16 performs this pulse modulation based on a synchronization signal PSS-M generated by the pulse generator. The synchronization signal PSS-M is a signal which determines a cycle and a duty ratio of the power of the microwave. As an example of settings for the pulse modulation, a pulse frequency may be in a range from 1 Hz to 20 kHz, and a pulse duty ratio (a ratio of a High-level power period to the pulse cycle) is in a range from 10% to 90%. The microwave output device 16 may pulse-modulate the power of the microwave so that the power of the microwave is synchronized with the pulse-modulated high frequency power outputted by the high frequency power supply 58.

The plasma processing apparatus 1 is further equipped with a waveguide 21, a tuner 26, a mode converter 27, and a coaxial waveguide 28. An output unit of the microwave output device 16 is connected to one end of the waveguide 21. The other end of the waveguide 21 is connected to the mode converter 27. The waveguide 21 is, by way of non-limiting example, a rectangular waveguide. The waveguide 21 is provided with the tuner 26. The tuner 26 has stubs 26a, 26b and 26c. Each of the stubs 26a to 26c is configured such that a protruding amount thereof into an internal space of the waveguide 21 is adjustable. By adjusting protruding positions of the stubs 26a, 26b and 26c with respect to a reference position, the tuner 26 matches an impedance of the microwave output device 16 and an impedance at a load side, for example, the chamber main body 12.

The mode converter 27 converts a mode of the microwave from the waveguide 21, and supplies the mode-converted microwave to the coaxial waveguide 28. The coaxial waveguide 28 includes an external conductor 28a and an internal conductor 28b. The external conductor 28a has a substantially cylindrical shape, and a central axis thereof substantially coincides with the axis Z. The internal conductor 28b has a substantially cylindrical shape, and is elongated inside the external conductor 28a. A central axis of the internal conductor 28b substantially coincides with the axis Z. This coaxial waveguide 28 transmits the microwave from the mode converter 27 to the antenna 18.

The antenna 18 is provided on a surface 20b of the dielectric window 20 opposite from the bottom surface 20a thereof. The antenna 18 includes a slot plate 30, a dielectric plate 32, and a cooling jacket 34.

The slot plate 30 is provided on the surface 20b of the dielectric window 20. This slot plate 30 is made of a metal having conductivity and has a substantially disk shape. A central axis of the slot plate 30 substantially coincides with the axis Z. The slot plate 30 is provided with a multiple number of slot holes 30a. As an example, these slots holes 30a form a plurality of slot pairs. Each of these slot pairs includes two slot holes 30a elongated in intersecting directions. The slot pairs are arranged along one or more concentric circles around the axis Z. Further, formed at a central portion of the slot plate 30 is a through hole 30d through which a conduit 36 to be described later can be inserted.

The dielectric plate 32 is provided on the slot plate 30. The dielectric plate 32 is made of a dielectric material such as quartz, and has a substantially disk shape. A central axis of this dielectric plate 32 substantially coincides with the axis Z. The cooling jacket 34 is provided on the dielectric plate 32. The dielectric plate 32 is provided between the cooling jacket 34 and the slot plate 30.

A surface of the cooling jacket 34 has conductivity. A path 34a is provided within the cooling jacket 34. A coolant is supplied into this path 34a. An upper surface of the cooling jacket 34 is electrically connected with a lower end of the external conductor 28a. Further, a lower end of the internal conductor 28b is electrically connected to the slot plate 30 through holes formed at central portions of the cooling jacket 34 and the dielectric plate 32.

The microwave from the coaxial waveguide 28 propagates within the dielectric plate 32 and is supplied to the dielectric window 20 through the slot holes 30a of the slot plate 30. The microwave supplied to the dielectric window 20 is then introduced into the processing space S.

The conduit 36 passes through an inner hole of the internal conductor 28b of the coaxial waveguide 28. Further, as stated above, the through hole 30d through which the conduit 36 can be inserted is formed at the central portion of the slot plate 30. The conduit 36 is extended through the inner hole of the internal conductor 28b and connected to a gas supply system 38.

The gas supply system 38 supplies the processing gas for processing the processing target object WP into the conduit 36. The gas supply system 38 may include a gas source 38a, a valve 38b, and a flow rate controller 38c. The gas source 38a is a gas source of the processing gas. The valve 38b serves to switch a supply and a stop of the supply of the processing gas from the gas source 38a. The flow rate controller 38c may be, for example, a mass flow controller, and controls a flow rate of the processing gas from the gas source 38a.

The plasma processing apparatus 1 may be further equipped with an injector 41. The injector 41 supplies the processing gas from the conduit 36 into a through hole 20h formed at the dielectric window 20. The processing gas supplied into the through hole 20h of the dielectric window 20 is then introduced into the processing space S. This processing gas is excited by the microwave introduced into the processing space S from the dielectric window 20. Accordingly, plasma is formed within the processing space S, and the processing target object WP is processed by active species such as ions and/or radicals from the plasma.

The plasma processing apparatus 1 is further equipped with a control device 100. The control device 100 controls the individual components of the plasma processing apparatus 1 in an overall manner. The control device 100 may be equipped with a processor such as a CPU, a user interface, and a storage.

The processor controls in overall the individual components such as the microwave output device 16, the stage 14, the gas supply system 38, the exhaust device 56, and so forth by executing programs and processing recipes stored in the storage.

The user interface includes a keyboard or a touch panel through which a process manager inputs a command or the like to manage the plasma processing apparatus 1, a display which visually displays an operational status of the plasma processing apparatus 1, and so forth.

The storage stores therein control programs (software) for implementing various processings performed in the plasma processing apparatus 1 under the control of the processor; processing recipes including processing condition data or the like; and so forth. When necessary, in response to an instruction from the user interface, the processor retrieves various control programs from the storage and executes them. Under this control of the processor, a required processing is performed in the plasma processing apparatus 1.

[Configuration Example of Microwave Output Device 16]

Figure 2:
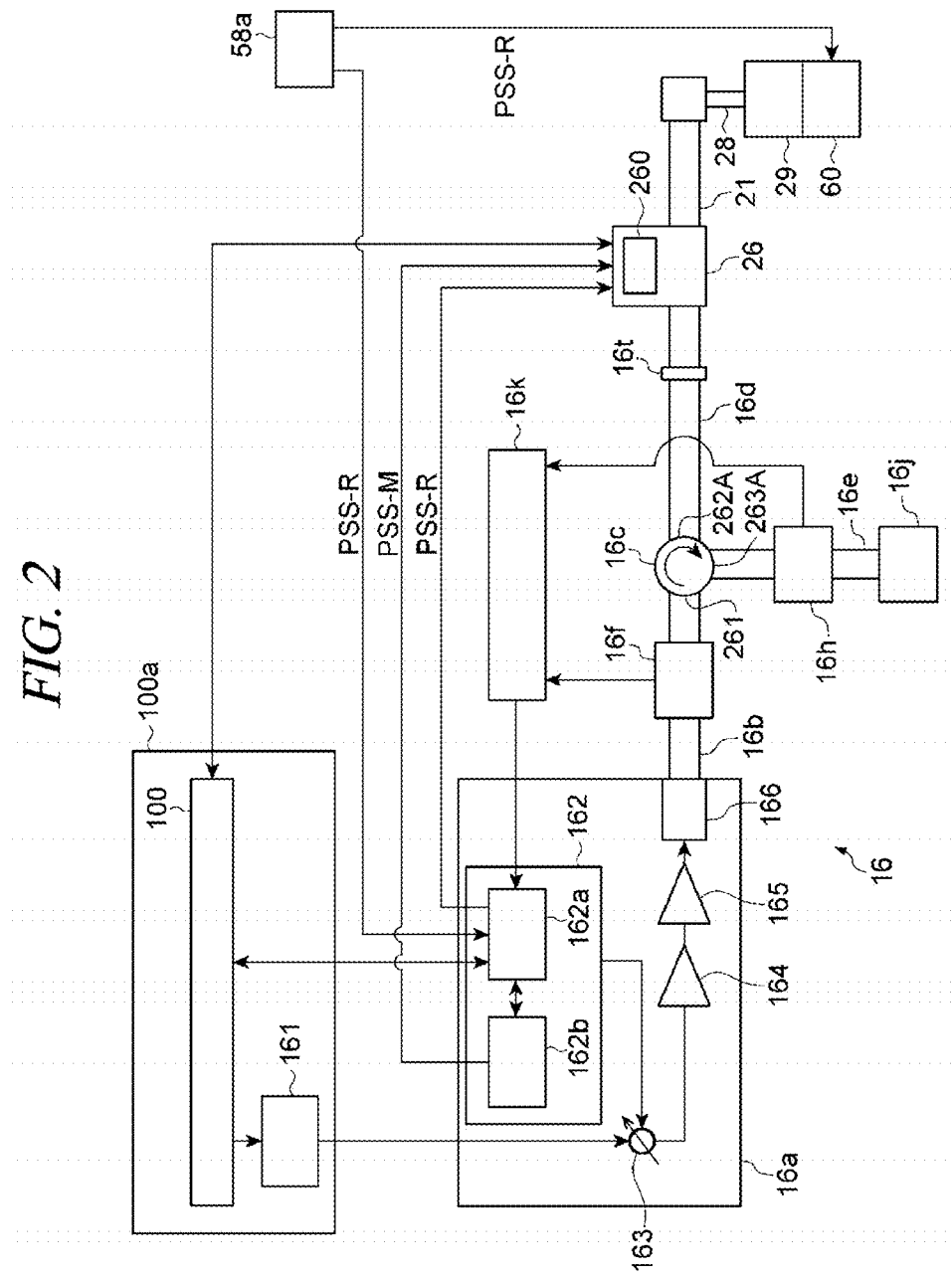
FIG. 2 is a diagram illustrating an example of a microwave output device.

FIG. 2 is a diagram illustrating an example of the microwave output device 16. As depicted in FIG. 2, the microwave output device 16 is connected to an operation device 100a having the control device 100 and a waveform generator 161.

The waveform generator 161 generates a waveform of a microwave. Specifically, the waveform generator 161 generates a waveform of the microwave having a median frequency and a bandwidth according to a set frequency and a set bandwidth designated by the control device 100. The waveform generator 161 outputs the generated waveform of the microwave to the microwave output device 16.

The microwave output device 16 modulates the waveform of the microwave from the waveform generator 161 in a pulse shape according to settings of the control device 100, and outputs this microwave having the pulse-modulated waveform. The microwave output device 16 includes a microwave generator 16a, a waveguide 16b, a circulator 16c, a waveguide 16d, a waveguide 16e, a first directional coupler 16f, a second directional coupler 16h, a measurer 16k (an example of a measuring unit), and a dummy load 16j.

The microwave generator 16a generates a microwave having a power which is pulse-modulated such that the microwave has a pulse frequency, a duty ratio, a High-level power and a Low-level power according to set values designated by the control device 100. The set values include a set pulse frequency, a set duty ratio, a set High level power, and a set Low level power.

The microwave generator 16a is equipped with a power controller 162, an attenuator 163, an amplifier 164, an amplifier 165, and a mode converter 166.

The waveform generator 161 is connected to the attenuator 163. The attenuator 163 is, for example, a device capable of varying an attenuation amount (attenuation rate) by adjusting an application voltage value. The attenuator 163 is connected with the power controller 162. The power controller 162 controls the attenuation rate (attenuation amount) of the microwave in the attenuator 163 by using the application voltage value. The power controller 162 controls the attenuation rate (attenuation amount) of the microwave in the attenuator 163 such that the microwave outputted by the waveform generator 161 becomes a microwave having a power according to set values. The set values include the set pulse frequency, the set duty ratio, the set High-level power and the set Low-level power designated by the control device 100.

The power controller 162 has, as an example, a controller 162a and a pulse generator 162b. The controller 162a may be a processor. The controller 162a acquires a setting profile from the control device 100. The controller 162a outputs information (the pulse frequency and the duty ratio) required for the pulse modulation in the setting profile to the pulse generator 162b. The pulse generator 162b generates the synchronization signal PSS-M based on the acquired information. The controller 162a determines the attenuation rate (attenuation amount) of the microwave based on the synchronization signal PSS-M and the setting profile set by the control device 100.

The controller 162a may acquire the synchronization signal PSS-R generated from the pulse generator 58a of the high frequency power supply 58. The pulse generator 162b may generate the synchronization signal PSS-M synchronized with the synchronization signal PSS-R. In this case, the pulse modulation of the microwave power and the pulse modulation of the high frequency power can be synchronized.

An output of the attenuator 163 is connected to the mode converter 166 via the amplifiers 164 and 165. The amplifiers 164 and 165 amplify the microwave at set amplification factors. The mode converter 166 converts a propagation mode of the microwave outputted from the amplifier 165 into TE01 from TEM. The microwave generated by the mode conversion in the mode converter 166 is outputted as an output microwave of the microwave generator 16a.

An output of the microwave generator 16a is connected to one end of the waveguide 16b. The other end of the waveguide 16b is connected to a first port 261 of the circulator 16c. The circulator 16c has the first port 261, a second port 262A, and a third port 263A. The circulator 16c is configured to output, from the second port 262A thereof, the microwave inputted to the first port 261, and output, from the third port 263A thereof, the microwave inputted to the second port 262A. The second port 262A of the circulator 16c is connected with one end of the waveguide 16d. The other end of the waveguide 16d is configured as an output unit 16t of the microwave output device 16.

The third port 263A of the circulator 16c is connected with one end of the waveguide 16e. The other end of the waveguide 16e is connected to the dummy load 16j. The dummy load 16j receives the microwave propagating in the waveguide 16e and absorbs this microwave. For example, the dummy load 16j converts the microwave into heat.

The first directional coupler 16f is provided between the one end and the other end of the waveguide 16b. The first directional coupler 16f is configured to split a part of the microwave propagating to the output unit 16t after being outputted from the microwave generator 16a (i.e., a progressive wave), and outputs this part of the progressive wave.

The second directional coupler 16h is provided between the one end and the other end of the waveguide 16e. The second directional coupler 16h is configured to split, for the microwave returned to the output unit 16t (that is, a reflection wave), a part of the reflection wave transmitted to the third port 263A of the circulator 16c, and outputs this part of the reflection wave.

The measurer 16k determines, based on the part of the progressive wave outputted from the first directional coupler 16f, a first High measurement value pf(H) and a first Low measurement value pf(L) respectively indicating a High level and a Low level of a power of the progressive wave in the output unit 16t. Further, the measurer 16k determines, based on the part of the reflection wave outputted from the second directional coupler 16h, a second High measurement value pr(H) and a second Low measurement value pr(L) respectively indicating a High level and a Low level of a power of the reflection wave in the output unit 16t.

The measurer 16k is connected to the power controller 162. The measurer 16k outputs measurement values to the power controller 162. The power controller 162 controls the attenuator 163 such that a difference between the measurement values of the progressive wave and the reflection wave, that is, a load power (effective power) coincides with a set power designated by the control device 100 (power feedback control).

The tuner 26 has a tuner controller 260. Based on a signal from the control device 100, the tuner controller 260 adjusts the protruding positions of the stubs 26a to 26c to match an impedance of the microwave output device 16 and an impedance of the antenna 18. The tuner controller 260 operates the stubs 26a, 26b and 26c by a driver circuit and an actuator (both are not illustrated).

The tuner controller 260 may acquire at least one of the synchronization signal PSS-M for the microwave power generated by the pulse generator 162b or the synchronization signal PSS-R for the high frequency power generated by the pulse generator 58a of the high frequency power supply 58. By way of example, the tuner controller 260 acquires the synchronization signal PSS-M from the controller 162a. The tuner controller 260 may acquire the synchronization signal PSS-R from the controller 162a or from the pulse generator 58a of the high frequency power supply 58 directly. The tuner controller 260 may operate the stubs 26a, 26b and 26c based on the synchronization signal(s).

[Details of Waveform Generator]

Figure 3:
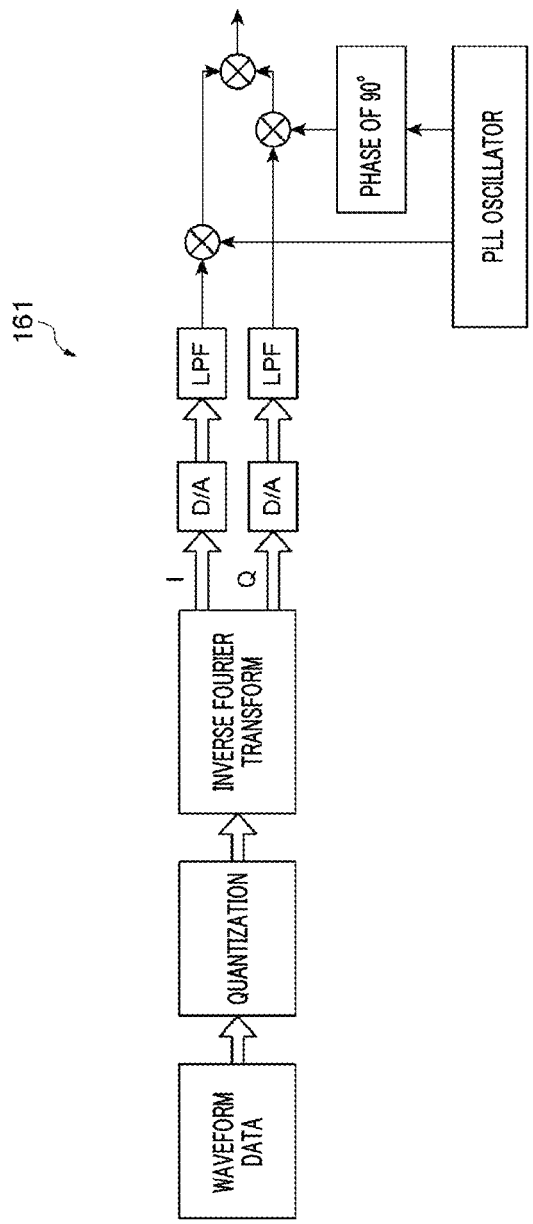
FIG. 3 is a diagram for describing the principle of microwave generation in a waveform generator.

FIG. 3 is a diagram for describing the principle of microwave generation in the waveform generator. As shown in FIG. 3, the waveform generator 161 includes, by way of example, a PLL (Phase Locked Loop) oscillator capable of oscillating a microwave having a phase synchronized with a reference frequency; and an IQ digital modulator connected to the PLL oscillator. The waveform generator 161 sets a frequency of the microwave oscillated from the PLL oscillator to the set frequency designated by the control device 100. Further, the waveform generator 161 modulates the microwave from the PLL oscillator and a microwave having a phase difference of 90° from the microwave from the PLL oscillator by using the IQ digital modulator. Accordingly, the waveform generator 161 generates a microwave having multiple frequency components within a band, or a microwave having a single frequency.

The waveform generator 161 is capable of generating the microwave having the multiple frequency components by generating continuous signals through, for example, inverse discrete Fourier transform upon n-number of complex data symbols. This method of signal generation may be the same as an OFDMA (Orthogonal Frequency-Division Multiple Access) modulation method used in digital TV broadcasting or the like (see, for example, Japanese Patent No. 5320260).

As an example, the waveform generator 161 has waveform data represented by a row of previously digitalized codes. The waveform generator 161 quantizes the waveform data, and generates I data and Q data by applying inverse Fourier transform to the quantized data. Further, the waveform generator 161 obtains two analog signals by applying D/A (Digital/Analog) conversion to the I data and the Q data. The waveform generator 161 inputs these analog signals to a LPF (Low Pass Filter) which allows only a low frequency component to pass therethrough. The waveform generator 161 mixes the two analog signals outputted from the LPF with the microwave oscillated from the PLL oscillator and the microwave having the phase difference of 90° from the microwave oscillated from the PLL oscillator, respectively. Then, the waveform generator 161 combines the microwaves generated by the mixing. Through these operations, the waveform generator 161 generates the microwave having the single frequency component or the multiple frequency components.

[Example of Microwave]

Figure 4:
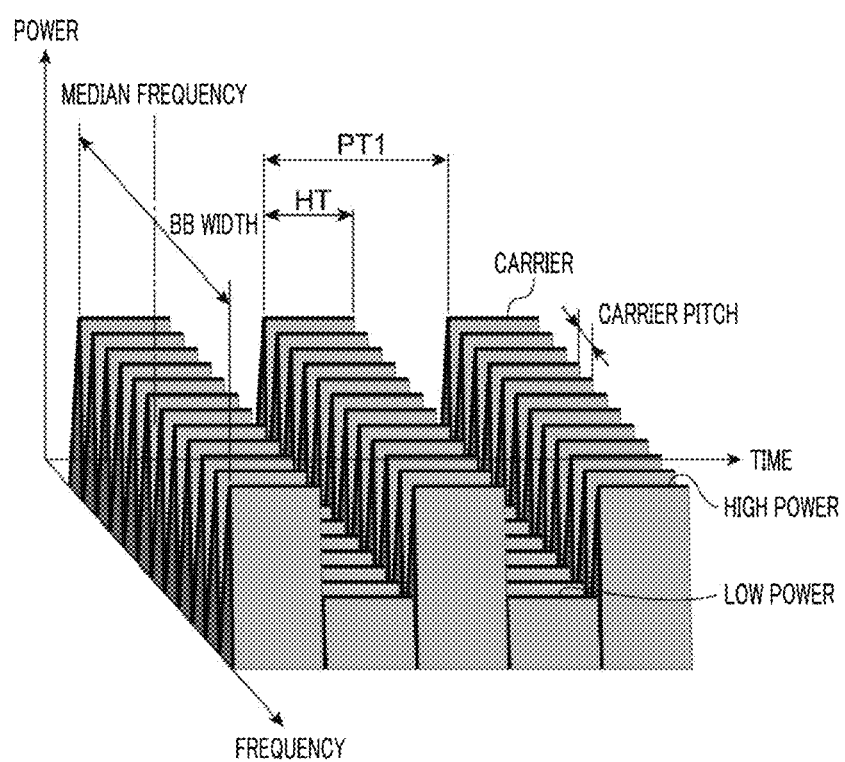
FIG. 4 illustrates an example of a microwave a power of which is pulse-modulated.

The power of the microwave outputted from the microwave generator 16a has the waveform modulated in the pulse shape such that the High-level power and the Low-level power are repeated. FIG. 4 illustrates an example of the microwave having the pulse-modulated power. As shown in FIG. 4, the microwave has a median frequency, a bandwidth and a carrier pitch according to the set frequency, the set bandwidth and the set carrier pitch designated by the control device 100. The microwave has a pulse frequency, a duty ratio, a High-level power and a Low-level power according to the set values designated by the control device 100. The set values include the set pulse frequency, the set duty ratio, the set High-level power and the set Low-level power. The Low-level power is a power having a level lower than a level of the High-level power. The Low-level power may be set to be higher than the lowest power level required to maintain a plasma formation state, or may be set to be zero. A single waveform of the microwave is referred to as a carrier. The carrier pitch is an interval between carriers, and a reciprocal of the carrier pitch becomes the longest cycle among power variation cycles of the microwave having the bandwidth.

Figure 5A:
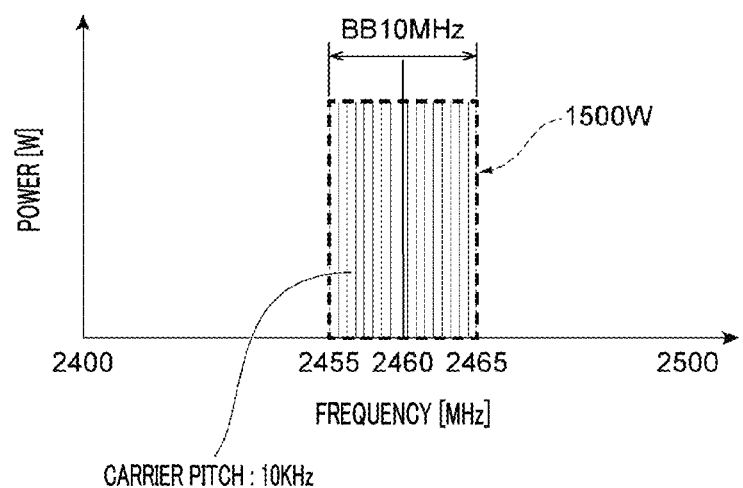
FIG. 5A and FIG. 5B are diagrams illustrating examples of microwaves having different carrier pitches.
Figure 5B:
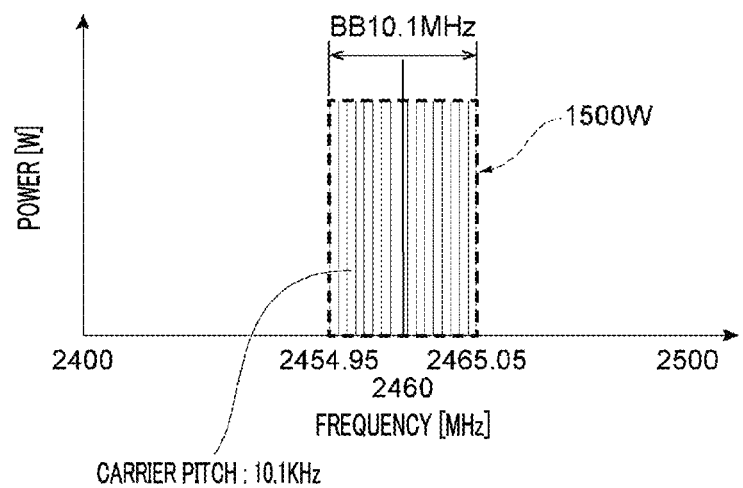

FIG. 5A and FIG. 5B illustrate examples of microwaves having different carrier pitches. FIG. 5A shows a microwave having a set frequency of 2460 MHz, a set bandwidth of 10 MHz, and a set carrier pitch of 10 kHz. By dividing the set bandwidth by the set carrier pitch and adding a value of 1 thereto, a carrier number can be obtained. Here, the carrier number is 1001. FIG. 5B shows a microwave having a set frequency of 2460 MHz, a set bandwidth of 10.1 MHz, and a set carrier pitch of 10.1 kHz. The carrier number thereof is 1001. Further, as shown in FIG. 5A and FIG. 5B, both of these microwaves have a power of 1500 W. That is, even if the microwaves have the same power, their set carrier pitches and the set bandwidths may be set to be different.

[Example of Synchronization Signal for Microwave]

FIG. 6 illustrates an example of a synchronization signal for pulse-modulating the microwave. As depicted in FIG. 6, the synchronization signal PSS-M is a pulse signal in which an ON state (High state) and an OFF state (Low state) appear alternately. A pulse cycle PT1 of the synchronization signal PSS-M is defined as an interval between times when the High-level appears. If a difference between the High level and the Low level is Δ, a High period HT is defined as a period from a time when the difference becomes 0.5Δ in a pulse-up period PU to a time when the difference becomes 0.5Δ in a pulse-down period PD. A ratio of the High period HT to the pulse cycle PT1 is a duty ratio. The pulse generator 162b generates the synchronization signal as shown in FIG. 6 based on a pulse frequency (1/PT1) and a duty ratio (HT/PT1×100[%]) designated by the control device 100.

[Example of Power Feedback]

Figure 7:
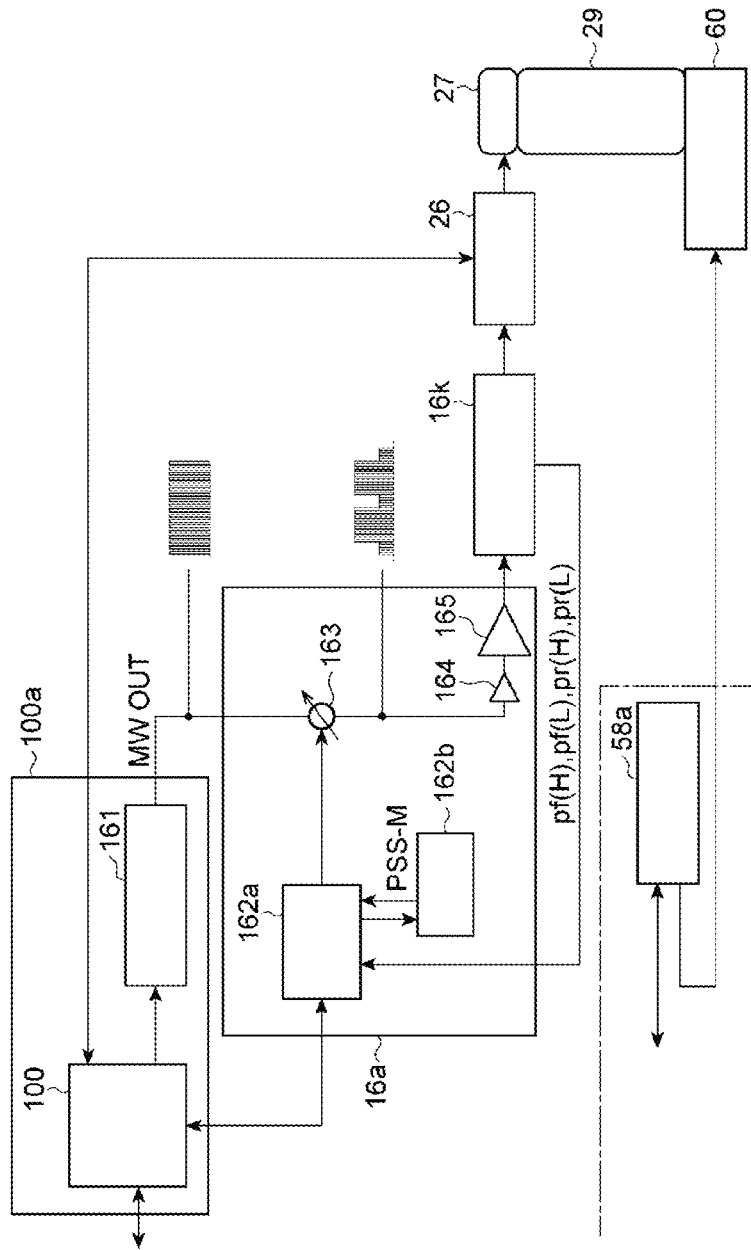
FIG. 7 is a diagram illustrating an example configuration regarding a power feedback of a microwave.

FIG. 7 is a diagram illustrating a configuration regarding a power feedback of the microwave. As shown in FIG. 7, the power feedback is implemented by the measurer 16k, the controller 162a and the attenuator 163.

As depicted in FIG. 5A and FIG. 5B, the waveform generator 161 outputs a microwave having a multi-carrier bandwidth. As shown in FIG. 6, the controller 162a and the attenuator 163 pulse-modulates the microwave having the bandwidth. The microwave generator 16a outputs the pulse-modulated microwave. The measurer 16k measures powers of a progressive wave and a reflection wave of the microwave, and outputs measurement values to the controller 162a. The controller 162a performs the power feedback such that a difference between the measurement value of the power of the progressive wave and the measurement value of the power of the reflection wave becomes a set value. Through this feedback loop, the set values designated by the control device 100 are obtained.

Here, in case that the power of the microwave is pulse-modulated, a High-level power and a Low-level power need to be feedback-controlled individually except for a case where the Low-level power is set to be zero. That is, the measurer 16k measures a first High measurement value pf(H), a first Low measurement value pf(L), a second High measurement value pr(H), and a second Low measurement value pr(L), and outputs the measurement results to the controller 162a. The controller 162a switches the feedback control over the High-level power and the feedback control over the Low-level power based on the synchronization signal PSS-M.

In the feedback control over the High-level power, the controller 162a controls the High-level power of the pulse-modulated microwave based on the first High measurement value pf(H), the second High measurement value pr(H) and the set High-level power. Further, in the feedback control over the Low-level power, the controller 162a controls the Low-level power of the pulse-modulated microwave based on the first Low measurement value pf(L), the second Low measurement value pr(L) and the set Low-level power.

To be more specific, in the feedback control over the High-level power, the controller 162a controls a difference between the first High measurement value pf(H) and the second High measurement value pr(H). The controller 162a controls the High-level power of the microwave outputted from the microwave output device 16 to allow this difference to approach the set High-level power designated by the control device 100. Furthermore, in the feedback control over the Low-level power, the controller 162a controls a difference between the first Low measurement value pf(L) and the second Low measurement value pr(L). The controller 162a controls the Low-level power of the microwave outputted from the microwave output device 16 to allow this difference to approach the set Low-level power designated by the control device 100. Accordingly, a load power of the microwave supplied to a load connected to the output unit 16t becomes approximate to the set power. Further, in case that the Low-level power is set to be zero, only the feedback control over the High-level power needs to be performed.

[Switchover of Feedback Control Mode]

The controller 162a may change an operation of the feedback control based on a control mode. The control mode may be designated by the control device 100. By way of example, if the control mode designated by the control device 100 is a PL mode, the controller 162a controls the power of the microwave by using the difference between the powers of the progressive wave and the reflection wave, as stated above. If the control mode set by the control device 100 is a Pf mode, on the other hand, the controller 162a controls the power of the microwave by using the power of the progressive wave only. As a more specific example, the controller 162a is operated as follows when the control mode designated by the control device 100 is the Pf mode. The controller 162a controls the High-level power of the pulse-modulated microwave such that the first High measurement value pf(H) becomes approximate to the set High-level power. Further, the controller 162a controls the Low-level power of the pulse-modulated microwave such that the first Low measurement value pf(L) becomes approximate to the set Low-level power.

[Relationship Between Synchronization Signals of Microwave Power and High Frequency Power]

Both the microwave power and the high frequency power are pulse-controlled. In the configuration shown in FIG. 7, the synchronization signal PSS-R of the high frequency power is not inputted to the controller 162a. Further, the synchronization signal PSS-M of the microwave is not inputted to the high frequency power 58. For the reason, the microwave power and the high frequency power are asynchronous.

Figure 8:
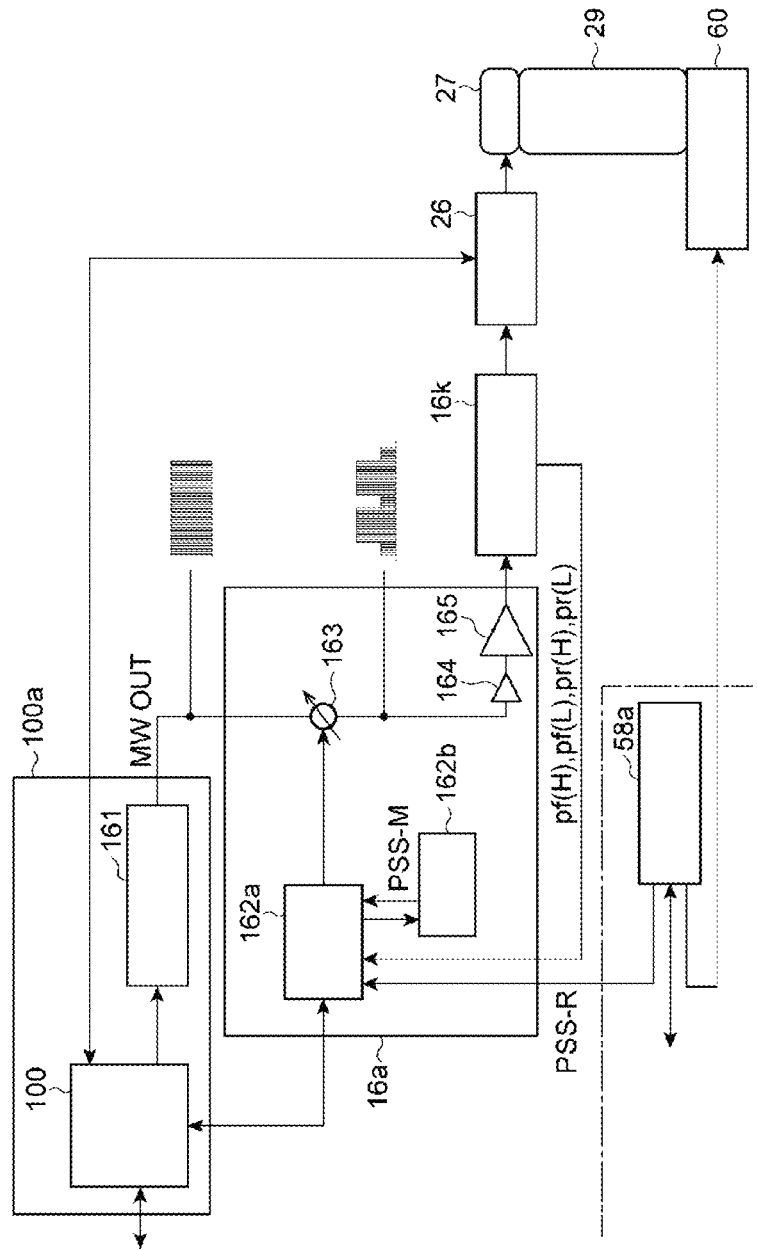
FIG. 8 is a diagram illustrating another example configuration regarding a power feedback of a microwave.

In one exemplary embodiment, the microwave power and the high frequency power may be synchronized. In this case, an effect of the pulse modulation of the high frequency power upon the reflection wave of the microwave can be reduced. FIG. 8 is a diagram illustrating another example configuration regarding the power feedback of the microwave. This another example configuration is identical to the configuration of the asynchronous power feedback shown in FIG. 7 except that the microwave output device generates a microwave a power of which is pulse-modulated to be synchronized with the high frequency power. The pulse generator 58a of the high frequency power 58 outputs a synchronization signal PSS-R of the high frequency power to the controller 162a. The controller 162a outputs a synchronization trigger for synchronization with the synchronization signal PSS-R to the pulse generator 162b. Based on this synchronization trigger, the pulse generator 162b generates a synchronization signal PSS-M of the microwave power synchronized with the synchronization signal PSS-R. The controller 162a controls the attenuator 163 by using the synchronization signal PSS-M. As a result, the microwave the power of which is pulse-modulated to be synchronized with the high frequency power is outputted.

[Detailed Configuration Regarding Power Feedback]

[First Example of Detailed Configuration]

Figure 9:
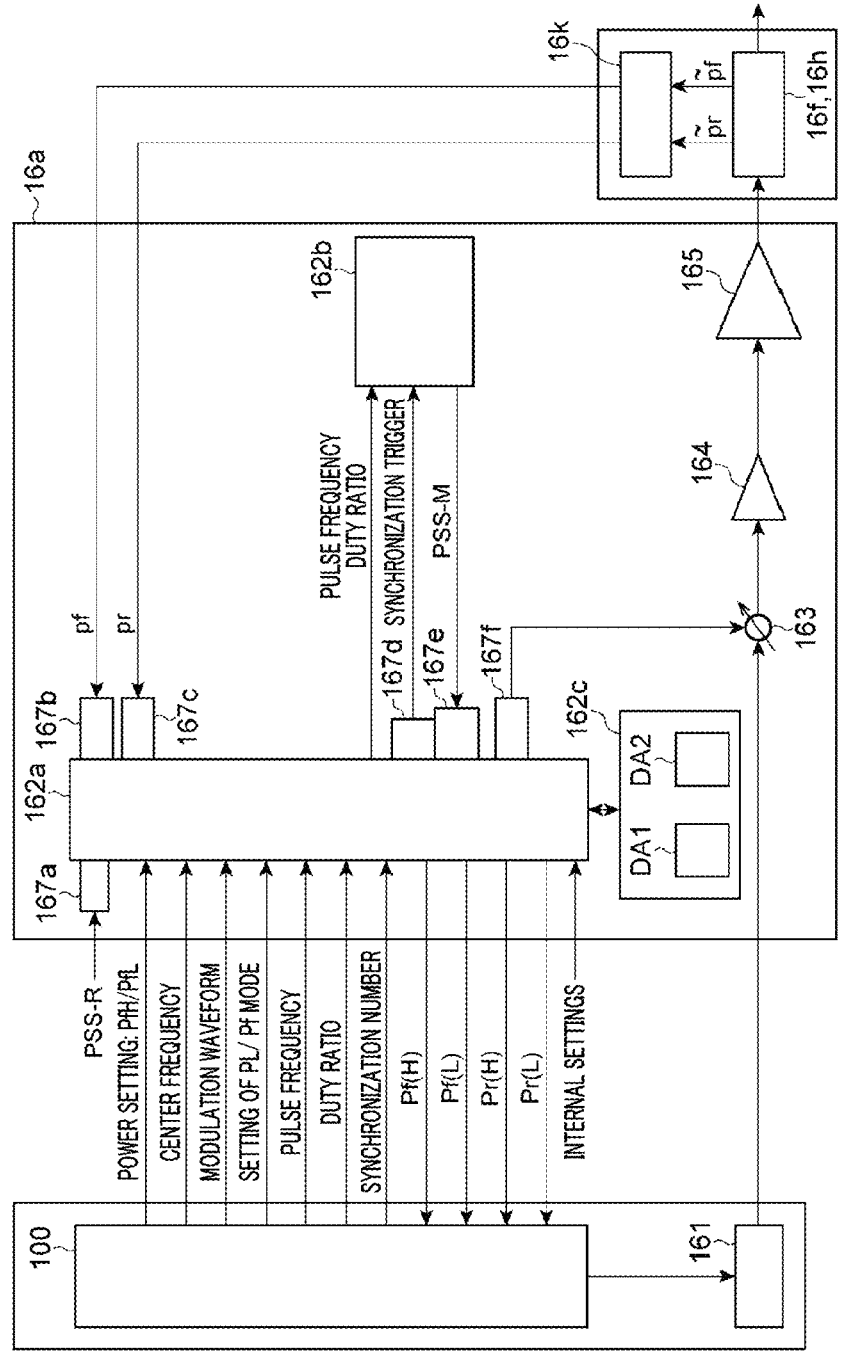
FIG. 9 is a diagram illustrating a first example of a detailed configuration regarding a power feedback of the microwave output device.

FIG. 9 is a diagram illustrating a first example of a detailed configuration regarding the power feedback of the microwave output device. As depicted in FIG. 9, the controller 162a of the microwave generator 16a acquires the setting profile from the control device 100. The setting profile includes at least a set High-level power PfH, a set Low-level power PfL, a set pulse frequency, a set duty ratio, and a synchronization number. The synchronization number is an identifier for selecting the kind of synchronization. By way of example, with the identifier '1', a time when the microwave power becomes the High level is synchronized with a time when the high frequency power becomes the High level. With the identifier '2,' a time when the microwave power becomes the Low level is synchronized with a time when the high frequency power becomes the Low level. In case that the synchronization number is not designated, the synchronization signal of the microwave and the synchronization signal of the high frequency power are asynchronous. Alternatively, one of synchronization numbers may be allotted for asynchronization. The setting profile may further include settings of a center frequency, a modulation waveform, a set carrier pitch, and PL/Pf modes. The modulation waveform is a set bandwidth. The controller 162a outputs the pulse frequency and the duty ratio acquired from the control device 100 to the pulse generator 162b.

The controller 162a is equipped with a pulse input device 167a. The controller 162a acquires the synchronization signal PSS-R of the high frequency power through the pulse input device 167a. The controller 162a generates the synchronization trigger based on the synchronization signal PSS-R and the synchronization number. In case that the synchronization number is not designated, the controller 162*a* may not generate the synchronization trigger. The controller 162*a* is equipped with a pulse output device 167*d*. The controller 162*a* outputs the synchronization trigger to the pulse generator 162*b* through the pulse output device 167*d*.

The pulse generator 162*b* generates the synchronization signal PSS-M of the microwave based on the pulse frequency, the duty ratio and the synchronization trigger. If the synchronization signal of the microwave and the synchronization signal of the high frequency power are asynchronous, the pulse generator 162*b* generates the synchronization signal PSS-M of the microwave based on the pulse frequency and the duty ratio.

Based on the synchronization signal PSS-M, the controller 162*a* determines the application voltage value to the attenuator 163. The controller 162*a* outputs the application voltage value to a D/A converter 167*f*. The D/A converter 167*f* converts a digital signal of the outputted (set) voltage value to an analog signal. The controller 162*a* applies the voltage to the attenuator 163 through the D/A converter 167*f*. As a result, the pulse-modulated microwave is outputted from the microwave generator 16*a*.

The measurer 16*k* outputs the power of the progressive wave of the microwave outputted from the first directional coupler 16*f* and the power of the reflection wave of the microwave outputted from the second directional coupler 16*h* as a measurement value pf of the power of the progressive wave and a measurement value pr of the power of the reflection wave, respectively.

The controller 162*a* is equipped with A/D converters 167*b* and 167*c* configured to convert an analog signal to a digital signal. The controller 162*a* acquires the measurement values pf of the power of the progressive wave and the measurement values pr of the power of the reflection wave from the measurer 16*k* through the A/D converters 167*b* and 167*c*.

The controller 162*a* is configured to be able to refer to a storage 162*c*. The controller 162*a* is capable of specifying data to be acquired from the measurement values pf and pr by referring to definition data DA1 stored in the storage 162*c*. The definition data DA1 includes, by way of example, a mask (filter) which delimits a period during which sampling of data points is to be performed. By way of example, as the controller 162*a* inputs internal settings, the definition data DA1 is previously stored in the storage 162*c*.

The controller 162*a* refers to the definition data DA1. The controller 162*a* detects a High-level measurement value pfH and a Low-level measurement value pfL included in the measurement values pf of the power of the progressive wave. Further, the controller 162*a* detects a High-level measurement value prH and a Low-level measurement value prL included in the measurement values pr of the power of the reflection wave. The definition data DA1 includes, as an example, a definition that the High-level measurement values pfH and prH cannot be sampled in an H detection mask time (first mask period) from the time when the power of the microwave reaches the High-level until a predetermined time elapses. The definition data DA1 includes, as an example, a definition that the Low-level measurement values pfL and prL cannot be sampled in an L detection mask time (second mask period) from the time when the measurement value of the power of the microwave reaches the Low-level until a predetermined time passes by. The definition data DA1 includes, as an example, a definition that the High-level power is measured in an H detection time (first sampling period) from the end of the H detection mask time to the time when the measurement value of the power of the microwave reaches the Low-level. Furthermore, the definition data DA1 includes a definition that the Low-level power is measured in an L detection time (second sampling period) from the end of the L detection mask time to the time when the measurement value of the power of the microwave reaches the High-level.

The controller 162*a* stores the detected measurement values pfH, pfL, prH and prL in the storage 162*c* in a time series. As a result, a time series buffer DA2 is generated. The time series buffer DA2 is used to average the measurement values. The controller 162*a* calculates a moving average time of each of the measurement values pfH, pfL, prH and prL by referring to the time series buffer DA2. The controller 162*a* calculates averaged measurement values Pf(H), Pf(L), Pr(H) and Pr(L) by using the respective moving average times.

The controller 162*a* determines the application voltage value of the attenuator 163 by using the averaged measurement values Pf(H), Pf(L), Pr(H) and Pr(L), the set High-level power PfH and the set Low-level power PfL. By using the averaged measurement values, the set High-level power PfH and the set Low-level power PfL, the controller 162*a* decides the application voltage value of the attenuator 163 to allow the output of the microwave generator 16*a* to approach the set power. By way of example, the controller 162*a* decides a first signal (application voltage value for the High-level power) for adding a first attenuation amount to the power of the microwave; and a second signal (application voltage value for the Low-level power) for adding a second attenuation amount to the power of the microwave. The controller 162*a* applies the voltages to the attenuator 163 through the D/A converter 167*f*. As a result, the power feedback control is carried out.

The controller 162*a* may output the averaged measurement values to the control device 100. The averaged measurement values may be stored in the storage of the control device 100 as log information or operation information of the apparatus, or outputted to the outside of the apparatus.

[Second Example of Detailed Configuration]

Figure 10:
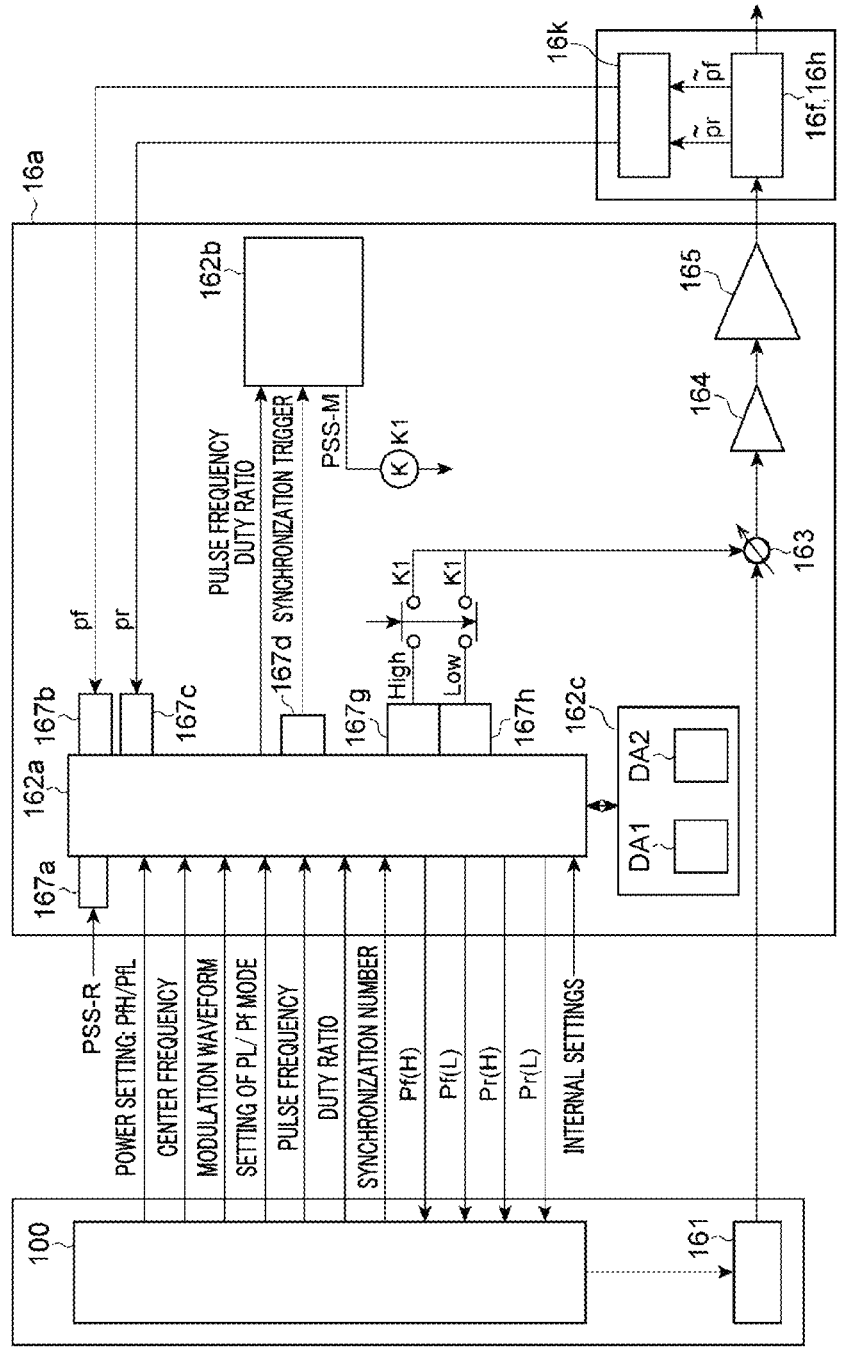
FIG. 10 is a diagram illustrating a second example of a detailed configuration regarding a power feedback of the microwave output device.

FIG. 10 is a diagram showing a second example of the detailed configuration regarding the power feedback of the microwave output device. As compared to the configuration according to the first example shown in FIG. 9, a D/A converter 167*g* for High signals and a D/A converter 167*h* for Low signals are provided in the configuration according to the second example, instead of the D/A converter 167*f*. Further, in the configuration according to the second example, the synchronization signal PSS-M is not outputted from the pulse output device 167*d* to the controller 162*a*. The first example and the second example are identical except for these. Thus, redundant description as already made in FIG. 9 will be omitted here.

The controller 162*a* is connected with the D/A converter 167*g* (first converter) configured to D/A-convert the application voltage value for the High-level power and the D/A converter 167*h* (second converter) configured to D/A-convert the application voltage value for the Low-level power. The D/A converter 167*g* is previously set to output an analog signal according to the application voltage value for the High-level power. The D/A converter 167*h* is previously set to output an analog signal according to the application voltage value for the Low-level power. A solid state relay K1 (switch) is provided between the D/A converter 167*g* and the attenuator 163 to switch connection/disconnection between the D/A converter 167*g* and the attenuator 163, and a solid state relay K1 (switch) is provided between the D/A converter 167h and the attenuator 163 to switch connection/disconnection between the D/A converter 167h and the attenuator 163. Each solid state relay K1 directly refers to the synchronization signal PSS-M from the pulse output device 167d, and switches the connection/disconnection. Accordingly, in the configuration of the second example, the application voltage value for the High-level power and the application voltage value for the Low-level power can be switched at a high speed, as compared to the configuration of the first example. That is, in the configuration of the second example, the microwave power can be pulse-modulated at a shorter cycle, as compared to the configuration of the first example.

[Averaging of Microwave Power]

The waveform of the power of the microwave having the multi-carrier bandwidth has periodicity. As an example, when the bandwidth is 10 MHz, the carrier pitch is 10 kHz, and the pulse modulation is not performed, the power of the microwave has a cycle of 100 µs. In general, an output of a wave detector is an output according to an amplitude. When this output is converted to a power, an error is generated between a case where the microwave as a measurement target has a multi-carrier bandwidth and a case where it does not. Even if the microwave has the bandwidth, an average of power measurement values for the single cycle of 100 µs coincides with the power converted from the detection output. Further, by averaging the power measurement values one or more cycles repeatedly, the detection output and the power measurement value become coincident, so that accuracy of the power is improved. Since the power feedback control is performed based on this detection output, the set power and the power measurement value are coincident.

Meanwhile, assume that the bandwidth is 10 MHz, the carrier pitch is 10 kHz, the cycle is 100 µs, and the pulse modulation is performed. When cutting according to an ON time and an OFF time of the waveform set by the pulse frequency and the duty ratio, that is, extraction is performed periodically, measurement values are obtained only in a specific period in the single cycle of 100 µs. When the microwave has the bandwidth, the measurement values are not extracted only in the specific period of the single cycle, but they are extracted in the whole cycle as uniformly as possible. Thus, the power measurement value and the power converted from the detection output can be made to be coincident. Hereinafter, detailed description thereof will be provided.

Figure 11A:
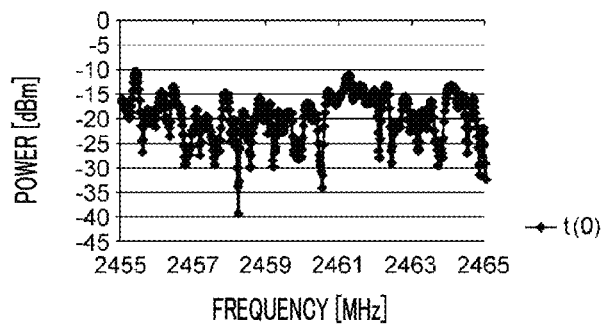
FIG. 11A to FIG. 11D present examples of power measurement values per 1 is for a microwave having a multi-carrier bandwidth with a cycle of 100 µs and a carrier pitch of 10.0 kHz.
Figure 11B:
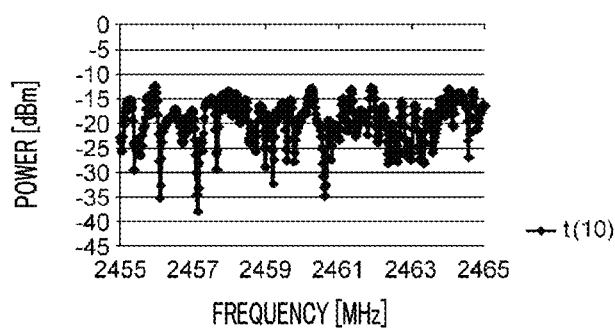
Figure 11C:
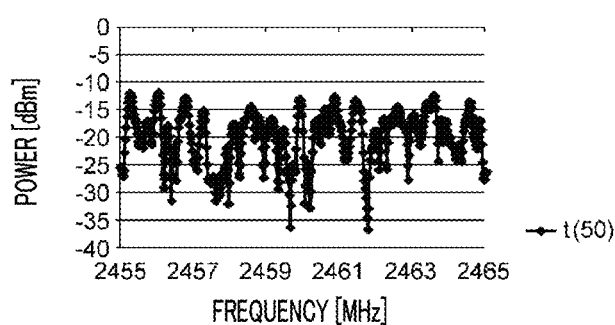
Figure 11D:
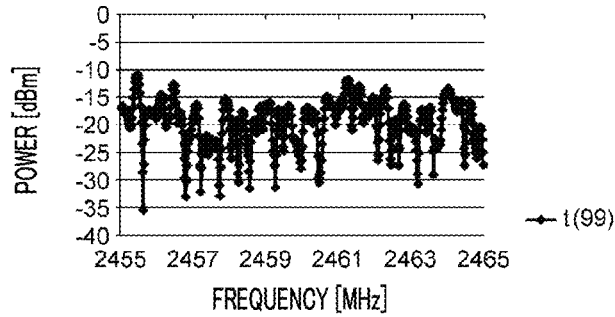

First, the case where the microwave power is not pulse-modulated periodically will be explained. FIG. 11A to FIG. 11D illustrate examples of waveforms (measurement values) per 1 µs for a microwave power having a single cycle of 100 µs. A horizontal axis thereof represents a frequency (MHz), and a vertical axis thereof indicates a power (dBm). A set bandwidth is 10 MHz, a set carrier pitch is 10 kHz, and a set power is 1500 W. Since the single cycle is 100 µs, the measurement of 1 µs is performed 100 times. In the following description, t denotes a counter of the repetition number of the measurement, and t is counted from 0 to 99. FIG. 11A shows a measurement result of a power distribution with respect to the frequency when t=0, and a voltage of a wave detector provided at an output side of the microwave is 1 V and a measurement value of a power of a progressive wave is 1506 W. FIG. 11B shows a measurement result of a power distribution with respect to the frequency when t=10, and the voltage of the wave detector provided at the output side of the microwave is 1 V and the measurement value of the power of the progressive wave is 1502 W. FIG. 11C shows a measurement result of a power distribution with respect to the frequency when t=50, and the voltage of the wave detector provided at the output side of the microwave is 1 V and the measurement value of the power of the progressive wave is 1527 W. FIG. 11D shows a measurement result of a power distribution with respect to the frequency when t=99, and the voltage of the wave detector provided at the output side of the microwave is 1 V and the measurement value of the power of the progressive wave is 1493 W. Here, if the time turns from t=99 to t=100, the measurement result returns to the power distribution with respect to the frequency that appears when t=0.

Figure 12A:
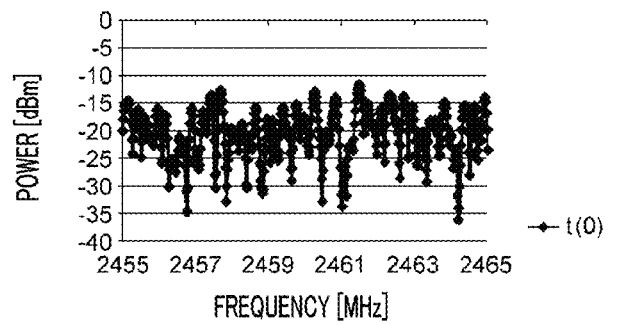
FIG. 12A to FIG. 12D present examples of power measurement values per 1 µs for a microwave having a multi-carrier bandwidth with a cycle of 99 µs and a carrier pitch of 10.1 kHz.
Figure 12B:
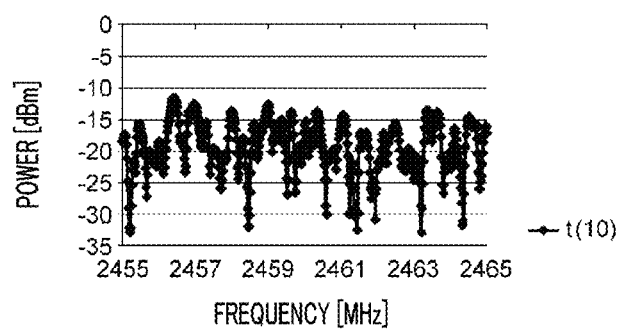
Figure 12C:
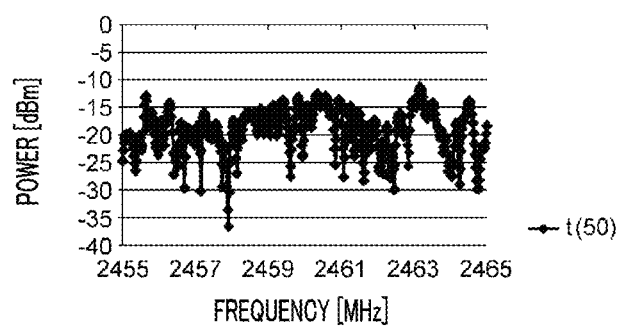
Figure 12D:
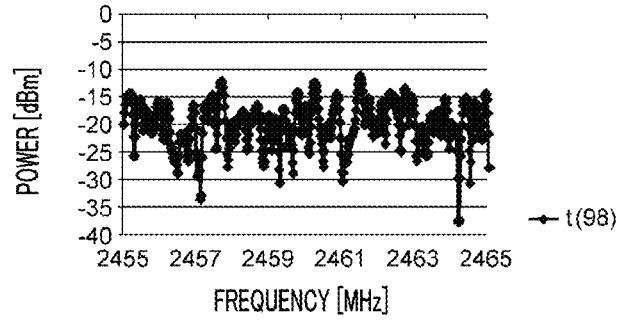

FIG. 12A to FIG. 12D illustrate examples of waveforms (measurement values) per 1 µs for a microwave power having a single cycle of about 99 µs. A horizontal axis thereof represents a frequency (MHz), and a vertical axis thereof indicates a power (dBm). A set bandwidth is 10.1 MHz, a set carrier pitch is 10.1 kHz, and a set power is 1500 W. Since the single cycle is about 99 µs, the measurement of 1 µs is performed 99 times. In the following description, t denotes a counter of the repetition number of the measurement, and t is counted from 0 to 98. FIG. 12A shows a measurement result of a power distribution for the frequency when t=0, and a voltage of a wave detector provided at an output side of the microwave is 1 V and a measurement value of a power of a progressive wave is 1547 W. FIG. 12B shows a measurement result of a power distribution for the frequency when t=1, and the voltage of the wave detector provided at the output side of the microwave is 1 V and the measurement value of the power of the progressive wave is 1454 W. FIG. 12C shows a measurement result of a power distribution for the frequency when t=50, and the voltage of the wave detector provided at the output side of the microwave is 1 V and the measurement value of the power of the progressive wave is 1453 W. FIG. 12D shows a measurement result of a power distribution for the frequency when t=99, and the voltage of the wave detector provided at the output side of the microwave is 1 V and the measurement value of the power of the progressive wave is 1517 W. Here, if the time turns from t=98 to t=99, the measurement result returns to the power distribution for the frequency that appears when t=0.

As depicted in FIG. 11A to FIG. 11D and FIG. 12A to FIG. 12D, the measurement result of the power with respect to the frequency and the measurement value of the power of the progressive wave repeatedly vary periodically. When the carrier pitch is 10 kHz, the cycle of the microwave is 100 µs, and when the carrier pitch is 10.1 kHz, the cycle of the microwave is about 99 µs.

Figure 13A:
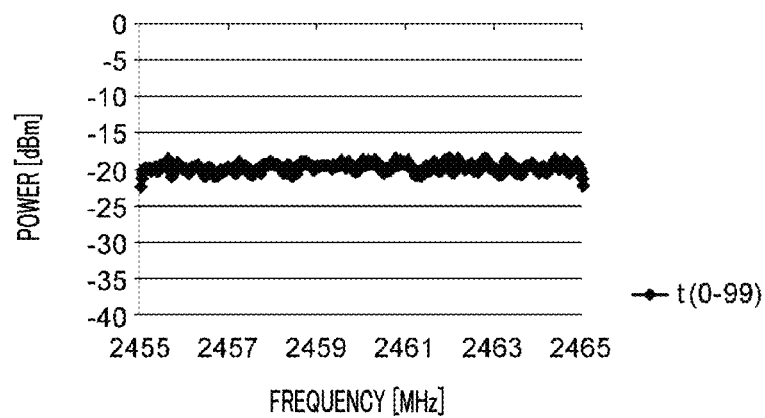
FIG. 13A and FIG. 13B provide examples of waveforms in which the measurement values are averaged.
Figure 13B:
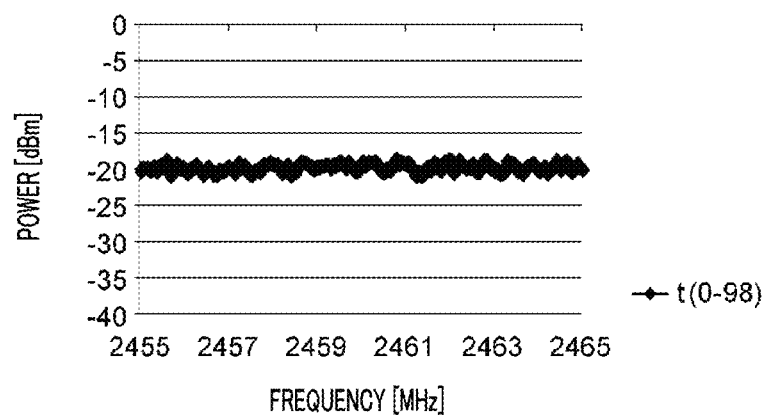

FIG. 13A and FIG. 13B show examples of waveforms obtained by averaging the power measurement values corresponding to the single cycle, and a horizontal axis thereof represents a frequency (MHz) and a vertical axis thereof indicates a power (dBm). FIG. 13A shows a result of averaging the power with respect to the frequency for the microwave having the set bandwidth of 10 MHz and the set carrier pitch of 10 kHz as described in FIG. 11A to FIG. 11D for a period of 100 µs in which t ranges from 0 to 99. The measurement value of the power of the progressive wave is 1500 W. FIG. 13B shows a result of averaging the power with respect to the frequency for the microwave having the set bandwidth of 10.1 MHz and the set carrier pitch of 10.1 kHz as described in FIG. 12A to FIG. 12D for a period of 99 µs in which t ranges from 0 to 98. The measurement value of the power of the progressive wave is 1500 W. As can be seen from this, regardless of the set bandwidth and the set carrier pitch, the set power and the measurement value of the power of the progressive wave become identical if the measurement values corresponding to the single cycle determined from the bandwidth and the carrier pitch are averaged. Therefore, the power becomes to have a flat shape for the frequencies within the set bandwidth.

Figure 14A:
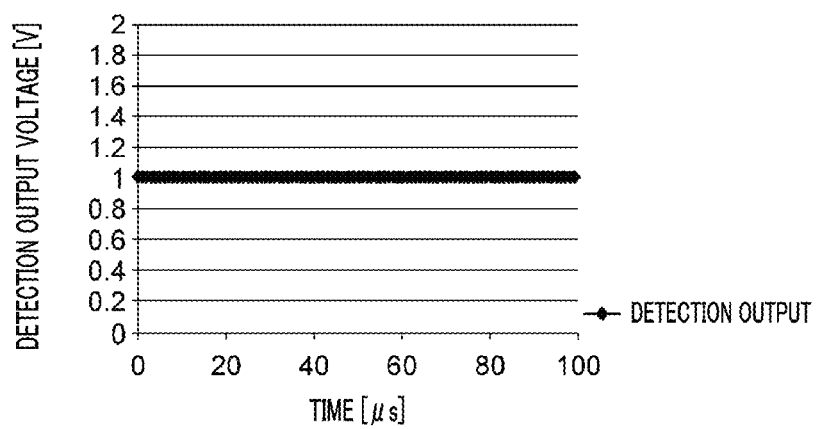
FIG. 14A to FIG. 14C present examples of graphs showing a case where a microwave power is not modulated periodically.
Figure 14B:
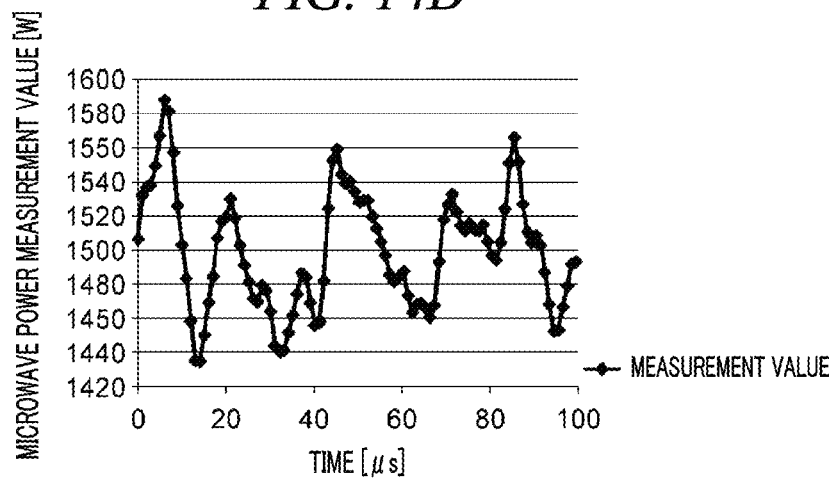
Figure 14C:
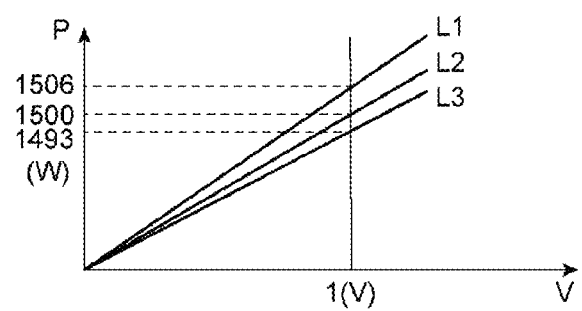

FIG. 14A to FIG. 14C show the example where the set bandwidth is 10 MHz, the set carrier pitch is 10 kHz, and the set power is 1500 W. A horizontal axis of FIG. 14A represents time (μs), and a vertical axis thereof indicates a detection output voltage (V). As shown in FIG. 14A, a voltage obtained by detecting an output of the microwave is maintained constant as 1 V regardless of time. A horizontal axis FIG. 14B represents time (μs), and a vertical axis thereof indicates a measurement value W of the microwave power. As depicted in FIG. 14B, the measurement value of the microwave power changes for the time ranging from 0 μs to 100 μs. A horizontal axis of FIG. 14C represents a detection output voltage (V), and a vertical axis thereof represents a microwave power (W). A second straight line L2 shown in FIG. 14C is a straight line obtained by using values which are obtained by averaging the measurement values of the microwave power from t=0 to t=99. A first straight line L1 is a straight line obtained by using the measurement results when t=0. A third straight line L3 is a straight line obtained by using the measurement results when t=99. Proportional integers of the first straight line L1 and the third straight line L3 vary according to the shape of the waveforms.

Figure 15A:
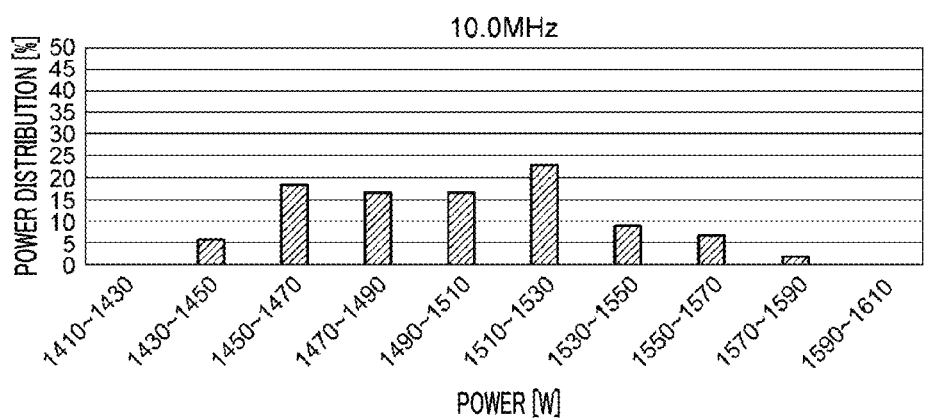
FIG. 15A and FIG. 15B provide examples of power distributions in the case where the microwave power is not modulated periodically.
Figure 15B:
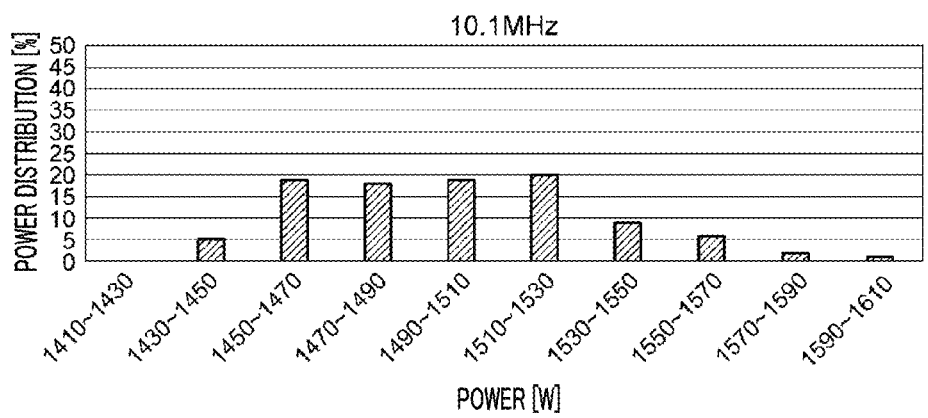

FIG. 15A and FIG. 15B illustrates examples of power distributions when the microwave power is not pulse-modulated periodically. FIG. 15A shows a power distribution of the microwave having the set bandwidth of 10 MHz and the set carrier pitch of 10 kHz. A horizontal axis of FIG. 15A represents a power (W), and a vertical axis thereof indicates a power distribution (%). FIG. 15B presents a power distribution of the microwave having the set bandwidth of 10.1 MHz and the set carrier pitch of 10.1 kHz. A horizontal axis of FIG. 15B represents a power (W), and a vertical axis thereof represents a power distribution (%). As depicted in FIG. 15A and FIG. 15B, when the power of the microwave is not pulse-modulated periodically, the power distribution shows the substantially same tendency regardless of the set bandwidth and the set carrier pitch.

Now, a case where the power of the microwave is pulse-modulated periodically will be discussed. As stated above, when the power is not pulse-modulated, the measurement value of the progressive wave repeatedly varies periodically with respect to the time. By averaging voltage values (measurement results feed-backed from the wave detector) detected at 1 μs in a period equal to or longer than the cycle of the microwave (here, equal to or larger than 100 μs), the voltage value is made constant. Then, the voltage value is converted to a power, and a power output is maintained constant. Here, in case that the power is pulse-modulated, a measurement time equal to or longer than the cycle of the microwave is required to measure a total power of an ON-time of a certain pulse (that is, an ON-time of the High level). The ON-time is obtained by dividing the cycle of the microwave by the set duty ratio. The set duty ratio may be the minimum value (lower limit) among multiple set duty ratios. When using a moving average as an average, a moving average time needs to be larger than the sum of the ON-time. That is, the moving average time needs to be larger than the sum of the values obtained by dividing the cycle of the microwave by the set duty ratio.

FIG. 16A and FIG. 16B illustrate examples of measurement values when the power of the microwave is pulse-modulated. The microwave is pulse-modulated with a set pulse frequency of 10 kHz and a set duty ratio of 10%. FIG. 16A shows measurement results when the set bandwidth is 10 MHz and the set carrier pitch is 10 kHz. FIG. 16B shows measurement results when the set bandwidth is 10.1 MHz and the set carrier pitch is 10.1 kHz. In tables of FIG. 16A and FIG. 16B, a detection output voltage, a power measurement value and an appearance number are specified for each counter t for the time of 10 ms. As shown in FIG. 16A, when the set carrier pitch is 10 kHz, there is found non-uniformity in the appearance number. As can be seen from FIG. 16B, on the other hand, the appearance number is relatively uniform when the set carrier pitch is 10.1 kHz.

Figure 17A:
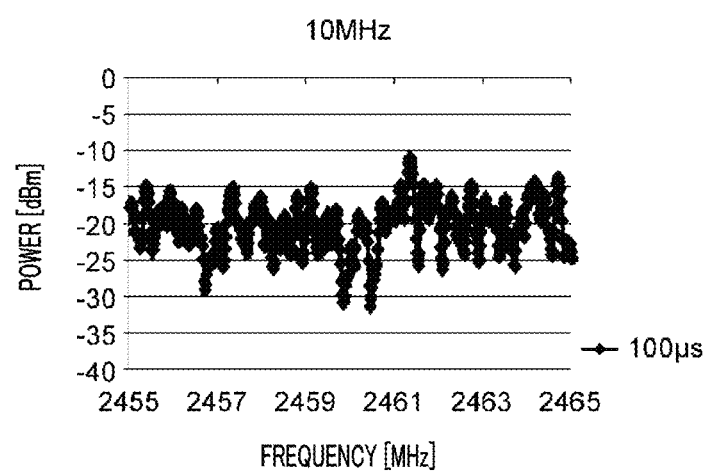
FIG. 17A and FIG. 17B depict examples of waveforms in which the measurement values are averaged.
Figure 17B:
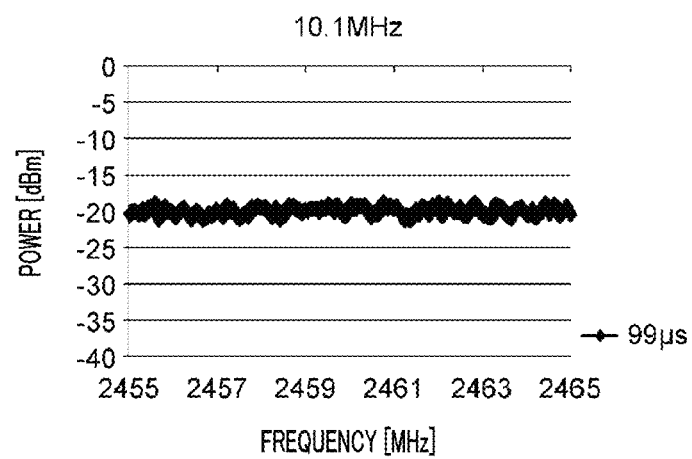

FIG. 17A and FIG. 17B show examples of waveforms obtained by averaging measurement values in a time of 10 ms. A horizontal axis thereof represents a frequency, and vertical axis thereof represents a power. FIG. 17A shows a waveform obtained by averaging the data shown in FIG. 16A. The set bandwidth is 10 MHz, and the set carrier pitch is 10 kHz. As shown in FIG. 17A, the power is not flat for the frequency, and there is found non-uniformity. FIG. 17B shows a waveform obtained by averaging the data shown in FIG. 16B. The set bandwidth is 10.1 MHz, and the set carrier pitch is 10.1 kHz. As shown in FIG. 17B, the power is flat for the frequency. As can be seen from this, when the power of the microwave is pulse-modulated periodically, there exists a condition that the averaged power varies, depending on the set bandwidth and the set carrier pitch.

Figure 18A:
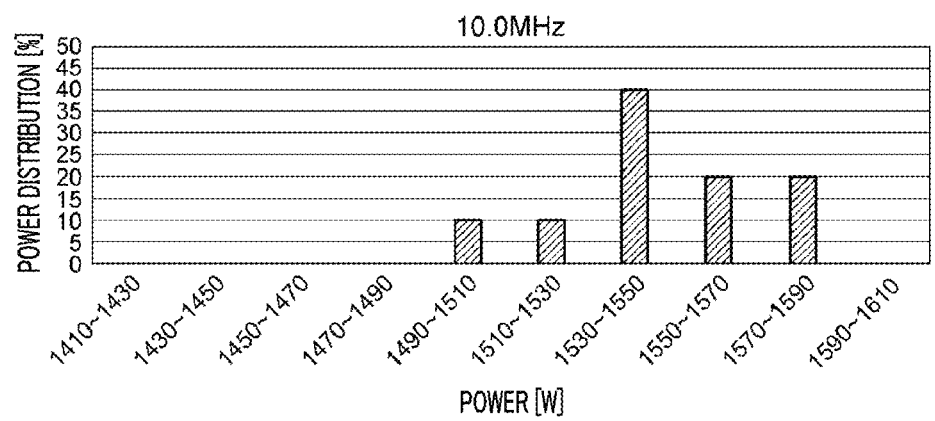
FIG. 18A and FIG. 18B provide examples of power distributions in the case where the microwave power is modulated periodically.
Figure 18B:
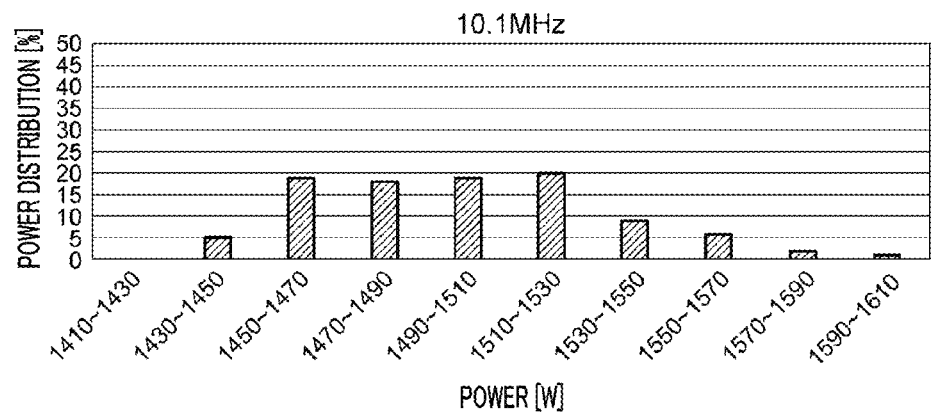

FIG. 18A and FIG. 18B present examples of power distributions when the power of the microwave is pulse-modulated periodically. FIG. 18A shows a power distribution of the microwave having the set bandwidth of 10 MHz and the set carrier pitch of 10 kHz. A horizontal axis thereof represents a power (W), and a vertical axis represents a power distribution (%). The averaged power is 1548 W. FIG. 18B shows a power distribution of the microwave having the set bandwidth of 10.1 MHz and the set carrier pitch of 10.1 kHz. A horizontal axis thereof represents a power (W), and a vertical axis represents a power distribution (%). The averaged power is 1500 W. As can be seen from FIG. 18A and FIG. 18B, when the power of the microwave is pulse-modulated periodically, the power distribution varies according to the set bandwidth and the set carrier pitch, which affects the averaged power.

Figure 19A:
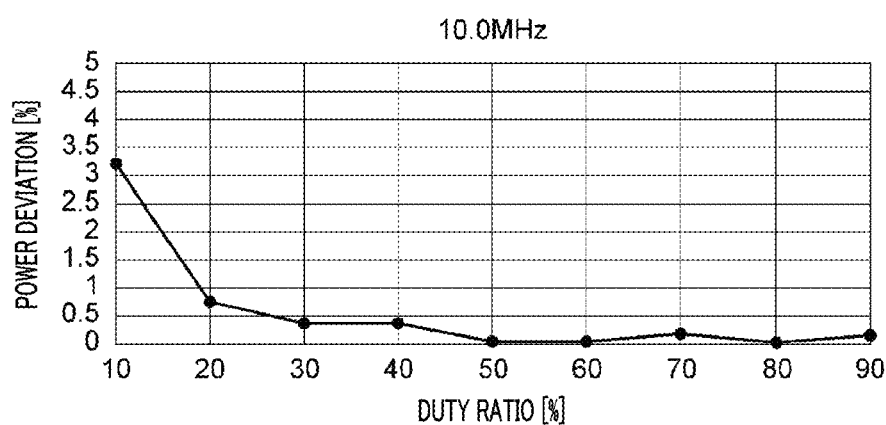
FIG. 19A and FIG. 19B present examples of graphs showing a relationship between a power deviation and a duty ratio.
Figure 19B:
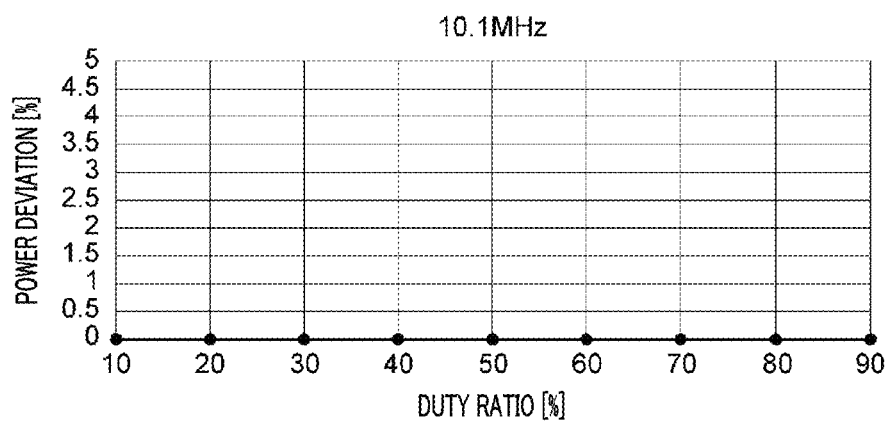

FIG. 19A and FIG. 19B present examples of graphs showing a relationship between a power deviation and a duty ratio. Here, the power deviation implies an error between a set power value and a power measurement value. FIG. 19A shows a graph of the microwave having the set bandwidth of 10 MHz and the set carrier pitch of 10 kHz. A horizontal axis thereof represents a duty ratio, and a vertical axis thereof indicates a power deviation. The power deviation starts to appear when the duty ratio is less than 50%, and is found to be the largest when the duty ratio is 10%. FIG. 19B shows a graph of the microwave having the set bandwidth of 10.1 MHz and the set carrier pitch of 10.1 kHz. A horizontal axis thereof represents a duty ratio, and a vertical axis thereof indicates a power deviation. In FIG. 19B, no power deviation is generated, regardless of the duty ratio.

Figure 20A:
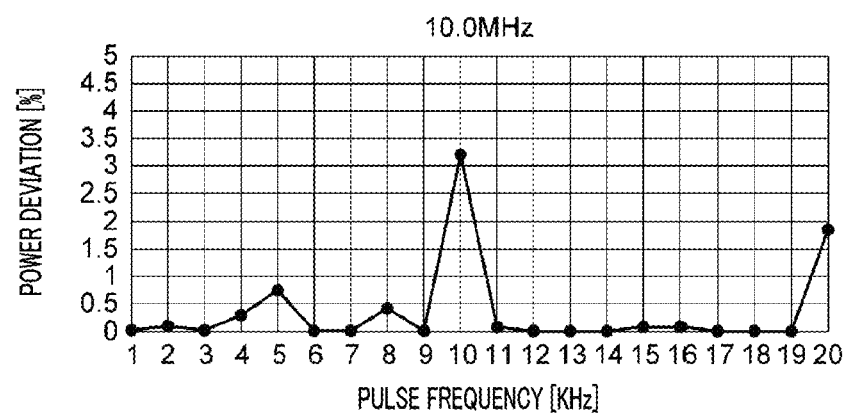
FIG. 20A and FIG. 20B provide examples of graphs showing a relationship between a power deviation and a pulse frequency.
Figure 20B:
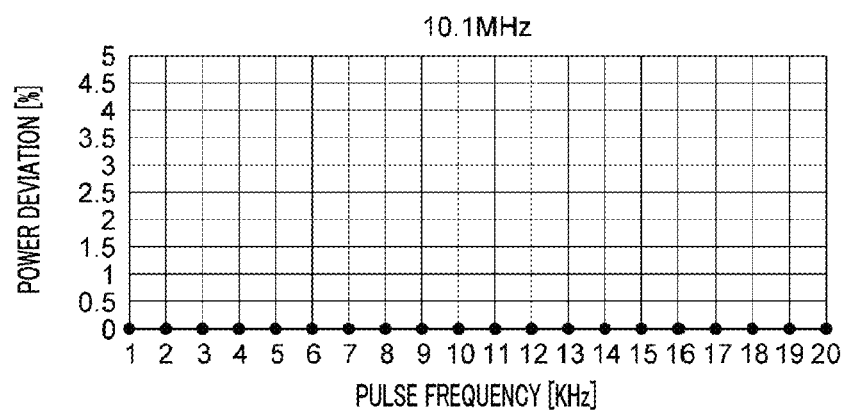

FIG. 20A and FIG. 20B provide examples of graphs showing a relationship between a power deviation and a pulse frequency. This graphs illustrates a case where the duty ratio is 10% when the power deviation is the largest. FIG. 20A shows a graph of the microwave having the set bandwidth of 10 MHz and the set carrier pitch of 10 kHz. A horizontal axis thereof represents a pulse frequency, and a vertical axis indicates a power deviation. When the pulse frequency is 5 kHz, 10 kHz, and 20 kHz, the power deviation is found to be large. FIG. 20B shows a graph of the microwave having the set bandwidth of 10.1 MHz and the set carrier pitch of 10.1 kHz. A horizontal axis thereof represents a pulse frequency, and a vertical axis thereof indicates a power deviation. In FIG. 20B, no power deviation is generated, regardless of the pulse frequency.

Figure 21A:
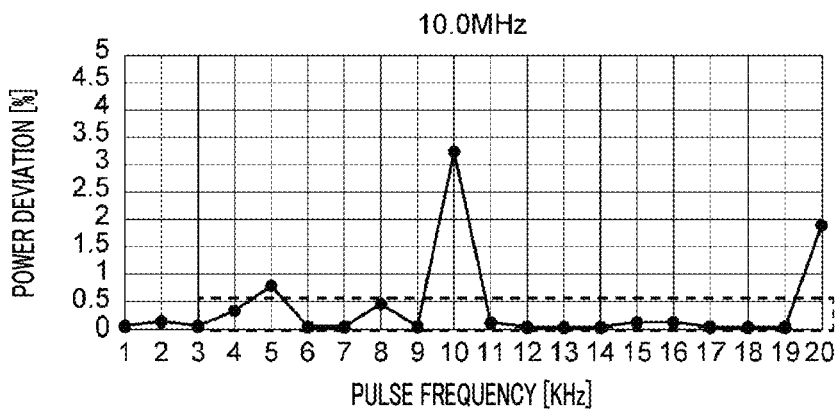
FIG. 21A to FIG. 21C present examples of graphs showing a relationship between a power deviation and a pulse frequency.
Figure 21B:
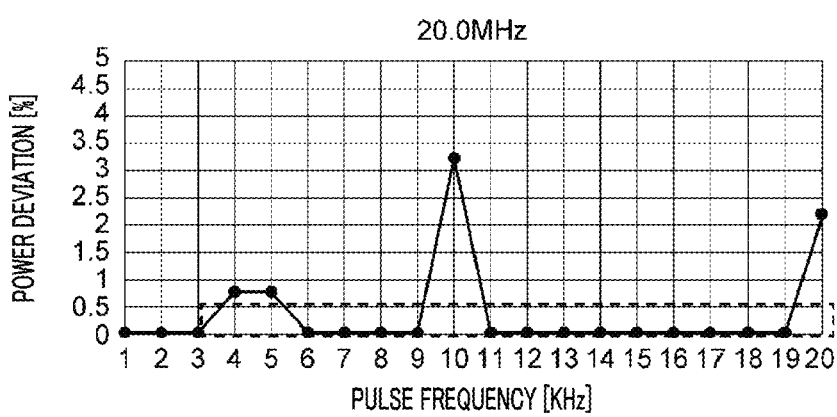
Figure 21C:
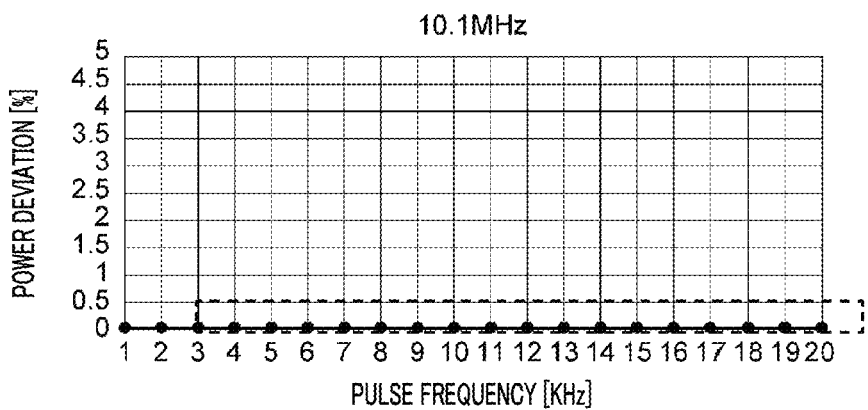

The power deviation at the aforementioned duty ratio and pulse frequency is deemed to be caused because an instant waveform extracted in the ON-time varies if an update cycle of the microwave having the multi-carrier bandwidth changes. FIG. 21A to FIG. 21C present examples of graphs showing a relationship between a power deviation and a pulse frequency. FIG. 21A provides a graph of a microwave having a set bandwidth of 10 MHz and a set carrier pitch of 10 kHz. A horizontal axis thereof represents a pulse frequency, and a vertical axis thereof indicates a power deviation. When the pulse frequency is 5 kHz, 10 kHz and 20 kHz, the power deviation is found to be large. Data indicated by a dashed line is data when the ON-time is less than 50% for the cycle of the microwave in the set duty ratio. FIG. 21B presents a graph of a microwave having a set bandwidth of 20.0 MHz and a set carrier pitch of 20 kHz. A horizontal axis thereof represents a pulse frequency, and a vertical axis thereof indicates a power deviation. When the pulse frequency is 4 kHz, 5 kHz, 10 kHz and 20 kHz, the power deviation is found to be large. Data indicated by a dashed line is data when the ON-time is less than 50% for the cycle of the microwave in the set duty ratio. FIG. 21C shows a graph of a microwave having a set bandwidth of 10.1 MHz and the set carrier pitch of 10.1 kHz. A horizontal axis thereof represents a pulse frequency, and a vertical axis thereof indicates a power deviation. In FIG. 21C, no power deviation is generated, regardless of the pulse frequency.

As can be seen from the above-described results, the power deviation is generated at the certain pulse frequency when the following conditions are satisfied. These conditions include a case when either a value obtained by dividing the set pulse frequency by the set carrier pitch or a value obtained by dividing the set carrier pitch by the set pulse frequency is an integer. Further, the conditions include a case when the ON-time of the High level with respect to the cycle of the microwave in the set duty ratio is less than 50%.

In view of these conditions, the controller 162a sets the set carrier pitch to satisfy the preset conditions as follows. The preset conditions include a first condition that the value obtained by dividing the set pulse frequency by the set carrier pitch or the value obtained by dividing the set carrier pitch by the set pulse frequency is not an integer. Further, the preset conditions include a second condition that the ON-time of the High level with respect to the set cycle of the microwave in the set duty ratio is equal to or larger than 50%. The controller 162a selects the set carrier pitch to satisfy both the first condition and the second condition. Further, the controller 162a sets the moving average time to be longer than the sum of the ON-time of the High level. By satisfying these first and second conditions, the generation of the power deviation can be avoided. Further, multiple bandwidths and multiple set carriers may be stored in a memory within the waveform generator 161.

So far, the various exemplary embodiments have been described. However, the present disclosure is not limited to the above-described exemplary embodiments, and various changes and modifications may be made.

In the above-described exemplary embodiments, the microwave generator 16a and the waveform generator 161 are provided separately. However, the microwave generator 16a and the waveform generator 161 may be configured as a single device.

In the above-described exemplary embodiments, the synchronization signal of the microwave power is generated to be synchronized with the synchronization signal of the high frequency power. However, the synchronization signal of the high frequency power may be generated to be synchronized with the synchronization signal of the microwave power.

When the plasma processing apparatus 1 uses the Pf mode only, the configuration in which the measurer 16k measures the reflection wave may not be provided.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

According to the exemplary embodiments, it is possible to provide the microwave output device and the plasma processing apparatus capable of controlling the pulse-modulated power of the microwave having the multi-carrier bandwidth accurately.

We claim:
1. A microwave output device, comprising:
a microwave generator configured to generate a microwave having a median frequency, a bandwidth and a carrier pitch respectively corresponding to a set frequency, a set bandwidth and a set carrier pitch instructed from a control device, a power of the microwave being pulse-modulated such that a pulse frequency, a duty ratio, a High level and a Low level become a set pulse frequency, a set duty ratio, a set power of High level and a set power of Low level instructed from the control device;
an output unit configured to output the microwave propagated from the microwave generator;
a first directional coupler configured to output a part of a progressive wave propagated from the microwave generator to the output unit; and
a measurer configured to determine a first High measurement value and a first Low measurement value respectively indicating a High level and a Low level of a power of the progressive wave in the output unit, based on the part of the progressive wave outputted from the first directional coupler,
wherein a reciprocal of the set carrier pitch becomes a longest cycle among power variation cycles of the microwave having the bandwidth, and the set carrier pitch is set to satisfy a preset condition,
the preset condition includes a condition that a value obtained by dividing the set pulse frequency by the set carrier pitch or a value obtained by dividing the set carrier pitch by the set pulse frequency is not an integer and a condition that an ON-time of the High level with respect to a set cycle in the set duty ratio is equal to or larger than 50%,
the microwave generator averages the first High measurement value and the first Low measurement value in a preset moving average time at a preset sampling interval, the preset moving average time being longer than a sum of the ON-time of the High level, the microwave generator controls the power of the High level of the pulse-modulated microwave based on the averaged first High measurement value and the set power of High level, and the microwave generator controls the power of the Low level of the pulse-modulated microwave based on the averaged first Low measurement value and the set power of Low level.

2. The microwave output device of claim 1, further comprising:
a second directional coupler configured to output a part of a reflection wave returned back to the output unit,
wherein the measurer determines a second High measurement value and a second Low measurement value respectively indicating a High level and a Low level of a power of the reflection wave in the output unit, based on the part of the reflection wave outputted from the second directional coupler,
the microwave generator averages the second High measurement value and the second Low measurement value in a preset moving average time at a preset sampling interval, the preset moving average time being longer than a sum of an ON-time of the High level,
the microwave generator controls the power of the High level of the pulse-modulated microwave based on the averaged first High measurement value, the averaged second High measurement value, and the set power of High level, and the microwave generator controls the power of the Low level of the pulse-modulated microwave based on the averaged first Low measurement value, the averaged second Low measurement value, and the set power of Low level.

3. The microwave output device of claim 1,
wherein the preset moving average time is longer than a sum of an OFF-time of the Low level.

4. The microwave output device of claim 1,
wherein the Low level is zero.

5. A plasma processing apparatus, comprising:
a chamber main body; and
a microwave output device as claimed in claim 1, the microwave output device being configured to output a microwave for exciting a gas supplied into the chamber main body.

* * * * *